United States Patent
Ookita et al.

(10) Patent No.: US 9,543,201 B2
(45) Date of Patent: Jan. 10, 2017

(54) METHOD FOR FORMING THREE-DIMENSIONAL INTERCONNECTION, CIRCUIT ARRANGEMENT COMPRISING THREE-DIMENSIONAL INTERCONNECTION, AND METAL FILM-FORMING COMPOSITION FOR THREE-DIMENSIONAL INTERCONNECTION

(71) Applicant: JSR Corporation, Minato-ku (JP)

(72) Inventors: Kenzou Ookita, Tokyo (JP); Isao Aritome, Tokyo (JP); Keisuke Kuriyama, Tokyo (JP); Taichi Matsumoto, Tokyo (JP); Kazuto Watanabe, Tokyo (JP); Atsushi Kobayashi, Tokyo (JP); Sugirou Shimoda, Tokyo (JP)

(73) Assignee: JSR Corporation, Minato-ku (JP)

( * ) Notice: Subject to any disclaimer, the term of this patent is extended or adjusted under 35 U.S.C. 154(b) by 0 days.

(21) Appl. No.: 14/836,236

(22) Filed: Aug. 26, 2015

(65) Prior Publication Data
US 2016/0064280 A1    Mar. 3, 2016

(30) Foreign Application Priority Data

Aug. 27, 2014 (JP) ................................ 2014-173318
Aug. 27, 2014 (JP) ................................ 2014-173343

(51) Int. Cl.
*H01L 21/768* (2006.01)
*H01L 23/535* (2006.01)
(Continued)

(52) U.S. Cl.
CPC ....... *H01L 21/76895* (2013.01); *H01L 21/288* (2013.01); *H01L 21/486* (2013.01);
(Continued)

(58) Field of Classification Search
CPC ............ H01L 2224/13147; H01L 2224/73265; H01L 21/76895; H01L 23/5226; H01L 21/76879; H01L 23/535; H01L 2225/06541; H01L 21/486; H01L 23/49827; H01L 23/53238; H01L 21/76898; H01L 23/481; H01L 2924/0002; H01L 2224/48227; H01L 21/76816; H01L 21/8221; H01L 23/528; H01L 21/76843; H01L 23/538
See application file for complete search history.

(56) References Cited

U.S. PATENT DOCUMENTS 6,048,790 A    4/2000 Iacoponi et al.
7,629,017 B2   12/2009 Kodas et al.
(Continued)

FOREIGN PATENT DOCUMENTS

JP    2000-68651 A    3/2000
JP    2001-35255 A    2/2001
(Continued)

OTHER PUBLICATIONS

Takashi Yoshinaga, et al., "The research-and-development trend of the TSV technology for three-dimensional LSI mounting" Technology Trend Research Center, National Institute of Science and Technology Policy, Ministry of Education, Culture, Sports, Science and Technology, vol. 10, No. 4, Issue No. 109, Apr. 2010, 63 Pages (with English language translation).
(Continued)

*Primary Examiner* — Jasmine Clark
(74) *Attorney, Agent, or Firm* — Oblon, McClelland, Maier & Neustadt, L.L.P.

(57) ABSTRACT

In a method for forming a three-dimensional interconnection, a contact plug is formed within a through hole provided in a substrate and an upper wire formed on an upper side of the substrate and a lower wire formed on a lower side are
(Continued)

electrically connected to one another by the contact plug. A coating film is formed on an upper surface of the substrate and inner surface of the through hole by applying a metal film-forming composition containing at least one salt of and a particle of a metal to the substrate provided with the through hole. A metal film is formed by heating the coating film, and plated by filling up the through hole by depositing a conductor on the metal film by a plating process using the metal film as a seed layer. An excess conductor deposited in the plating is removed by a chemical mechanical polishing process.

16 Claims, 22 Drawing Sheets

(51) Int. Cl.
    *H01L 23/522*     (2006.01)
    *H01L 23/485*     (2006.01)
    *H01L 23/498*     (2006.01)
    *H01L 21/48*     (2006.01)
    *H01L 21/288*     (2006.01)
    *H01L 23/48*     (2006.01)
    *H01L 23/14*     (2006.01)
    *H01L 23/532*     (2006.01)

(52) U.S. Cl.
    CPC .. *H01L 21/76843* (2013.01); *H01L 21/76873* (2013.01); *H01L 21/76879* (2013.01); *H01L 21/76898* (2013.01); *H01L 23/481* (2013.01); *H01L 23/485* (2013.01); *H01L 23/49827* (2013.01); *H01L 23/147* (2013.01); *H01L 23/53238* (2013.01); *H01L 23/53295* (2013.01); *H01L 2221/1089* (2013.01); *H01L 2924/0002* (2013.01)

(56) References Cited

U.S. PATENT DOCUMENTS

| | | | |
|---|---|---|---|
| 2003/0116057 A1 | 6/2003 | Suzuki et al. | |
| 2004/0249063 A1 | 12/2004 | Sterzel et al. | |
| 2011/0095435 A1* | 4/2011 | Volant | H01L 21/76898 |
| | | | 257/774 |
| 2011/0234893 A1 | 9/2011 | Koseki | |

FOREIGN PATENT DOCUMENTS

| | | |
|---|---|---|
| JP | 2002-121606 A | 4/2002 |
| JP | 2002-144523 A | 5/2002 |
| JP | 2004-39887 A | 2/2004 |
| JP | 2004-162110 A | 6/2004 |
| JP | 2005-2471 A | 1/2005 |
| JP | 2008-13466 A | 1/2008 |
| JP | 2008-31104 A | 2/2008 |
| JP | 2010-242118 A | 10/2010 |
| JP | 2011-34749 A | 2/2011 |
| JP | 2011-34750 A | 2/2011 |
| JP | 2011-205222 A | 10/2011 |

OTHER PUBLICATIONS

Takafumi Fukushima, et al., "TSV (Through-Si-Via) Formation Technologies for Three-Dimensionally Stacked Chips", Journal of the Japan Institute of Electronics Packaging vol. 12 (2009) No. 2, 16 pages (with English translation).

Denda Sei-Ichi "Silicon Penetration Electrode TSV, Advanced-Features Technology of a Semiconductor" Tokyo Denki University Press, First Edition, Apr. 10, 2011, 15 Pages (with English language translation of sections 6-7).

* cited by examiner

METHOD FOR FORMING THREE-DIMENSIONAL INTERCONNECTION, CIRCUIT ARRANGEMENT COMPRISING THREE-DIMENSIONAL INTERCONNECTION, AND METAL FILM-FORMING COMPOSITION FOR THREE-DIMENSIONAL INTERCONNECTION

CROSS-REFERENCE TO THE RELATED APPLICATION

The entire disclosure of the Japanese Patent Application No. 2014-173318 filed on Aug. 27, 2014 and 2014-173343 filed on Aug. 27, 2014 including specification, claims, drawings, and summary, on which the Convention priority of the present application is based, are incorporated herein in its entirety.

FIELD OF THE INVENTION

The present invention relates to a method for forming a three-dimensional interconnection, a circuit arrangement comprising three-dimensional interconnection, and a metal film-forming composition for three-dimensional interconnection.

In integrated circuits, circuit boards, and the like, in order to attain an increased packaging density, an increased wiring density, a reduced wiring length, and the like in circuit elements, there are often employed a three-dimensional interconnection technology in which a prescribed wire or circuit is designed into two or more separate wiring layers and these wiring layers are distributed on the upper surface and the lower surface of a substrate or are disposed in layer on one side of one substrate. For example, when two wiring layers are disposed separately on the upper surface and the lower surface, electric connection between the wiring layers is attained by a penetrating electrode that penetrates a substrate from one wiring layer side to the other wiring layer side (henceforth referred to as a contact plug). When laminating a plurality of wiring layers on one side of one substrate, electric connection is attained by a contact plug that penetrates an upper wiring layer and reaches a wiring layer located under the upper wiring layer. In "Through-Silicon Electrode, Tokyo Denki University Press, 2011", "Science & Technology Trends, April, 2010, pp. 23-33", and "Journal of the Japan Institute of Electronics Packaging, Vol. 12, No. 2, 2009", there is disclosed a technology of providing a silicon chip with a contact plug and electrically connecting a wire on the upper surface side of the silicon chip with an electrode on the lower surface side via the contact plug.

As a method for forming a contact plug, there is known a method of filling a conductive paste into a via hole for forming a contact plug. For example, JP 2002-144523 A and JP 2004-039887 A disclose a method of filling a conductive paste into a via hole with a squeegee. On the other hand, as a formation method capable of forming a contact plug that is thinner in diameter and higher in conductivity than a contact plug using a conductive paste, JP 2011-205222 A, JP 2000-068651 A, and "Through-Silicon Electrode, Tokyo Denki University Press, 2011", for example, disclose a method in which a seed layer is formed on an inner wall of a via hole by a physical vapor phase deposition process (PVD process), a chemical vapor phase deposition process (CVD process), an atomic layer deposition process (ALD process), or the like and then a conductor is deposited by an electroplating process, thereby filling up the via hole.

Moreover, as a method capable of forming a metal film in a lower cost and in a shorter time than the PVD process, the CVD process, the ALD process, etc. by which a film is formed in a low pressure atmosphere or in a vacuum, there is also known a method of forming a metal film by applying a dispersion liquid of a metal particle or a composition comprising a metal salt or the like as a precursor to a metal particle, and then performing heat treatment.

For example, JP 2001-035255 A and JP 2002-121606 A disclose that a metal film is formed by applying a dispersion liquid in which a metal ultrafine particle is dispersed in a dispersion medium onto a substrate, and then subjecting the dispersion liquid to heat treatment. JP 2008-013466 A, JP 2008-031104 A, and JP 2005-002471 A disclose that a copper wire is formed by applying a composition comprising copper formate and an amine onto a substrate, and then subjecting the composition to heat treatment in an argon atmosphere.

JP 2004-162110 A discloses that a copper wire is formed by applying a composition comprising a copper salt and an amine onto a substrate, and then subjecting the composition to heat treatment. JP 2010-242118 A discloses that a copper wire is formed by applying a composition comprising copper formate and an alkanol onto a substrate, and then subjecting the composition to heat treatment. JP 2011-034749 A and JP 2011-034750 A disclose that a copper wire is formed by applying a composition comprising a noble metal particulate, a copper salt and, a reducing agent, and a monoamine onto a substrate, and then subjecting the composition to heat treatment. Moreover, U.S. Pat. No. 6,048,790 B discloses that a copper wire is formed by applying a heat decomposable metal precursor onto a substrate, and then subjecting the metal precursor to heat decomposition in a reductive atmosphere. U.S. Pat. No. 7,629,017 B discloses a method of forming a conductor on a substrate by applying a conductive precursor comprising copper onto a substrate, and then heating.

From the perspective of forming a contact plug having good electrical conductivity, it is desirable to form the contact plug by a plating process. However, due to a recent increase in packaging density and a recent increase in wiring density, via holes are rendered smaller in diameter, and following this, the aspect ratio (the ratio of the depth to the opening diameter) of a via hole is becoming higher (larger). Therefore, it is becoming more difficult to form a seed layer within a via hole with good step coverage by either a vapor phase deposition process or a coating process.

When the step coverage of a seed layer is low, in filling up a via hole with metal by a plating process, the amount of deposition of metal on the upper end side of the via hole is greater than the amount of deposition on the lower end side, and it is likely to become difficult to deposit a sufficient amount of metal on the lower end side of the via hole and voids are likely to be generated. Moreover, a long time is required to deposit a sufficient amount of metal on the lower end side of the via hole and, as a result, a metal layer thicker than necessary is formed on the upper surface of the substrate and the removal thereof requires a long time, inducing, for example, deterioration in productivity, increase in production cost, and increase in takt time in removing an excess metal layer by chemical mechanical polishing (CMP), or the like. If a high performance vapor phase deposition apparatus is used, it is possible to form a seed layer in high step coverage even within a via hole with a high aspect ratio, but the use of such an apparatus leads to not only increase in production cost of three-dimensional interconnections but also deterioration in productivity.

An object of the present invention is to provide a method for forming a three-dimensional interconnection, the method being capable of forming a three-dimensional interconnection having good electrical conductivity in a relatively high productivity and in a relatively low production cost.

It is another object of the present invention to provide a circuit arrangement with three-dimensional interconnections having good electrical conductivity and being easy to produce at a relatively high productivity and at a relatively low production cost.

Still another object of the present invention is to provide a metal film-forming composition for a three-dimensional interconnection, the composition being capable of easily forming a metal film with good step coverage property within a through hole or a blind via hole even if the through hole or the blind via hole is large in aspect ratio.

The present inventors researched earnestly in order to solve the above-mentioned problems. As a result, they found that the above problems can be solved by a method for forming a three-dimensional interconnection having the following configurations, a circuit arrangement having a three-dimensional interconnection, and a metal film-forming composition for a three-dimensional interconnection, and thus they have accomplished the present invention.

SUMMARY OF THE INVENTION

According to one aspect of the present invention, a method for forming a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug includes forming a coating film on an upper surface of the substrate or the electrically insulative film and on an inner surface of the through hole or an inner surface of the blind via hole by applying a metal film-forming composition containing at least one of a salt of and a particle of a metal selected from Group 10 and Group 11 of the Periodic Table to the substrate or the electrically insulative film provided with the through hole or to the substrate or the electrically insulative film provided with the blind via hole becoming the through hole. Heating the coating film to form a metal film. Plating is performed by filling up the through hole or the blind via hole by depositing a conductor on the metal film by a plating process using the metal film as a seed layer. Removing an excess conductor deposited in the plating by a chemical mechanical polishing process.

According to another aspect of the present invention, a method for forming a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug includes forming a coating film on an upper surface of the substrate or the electrically insulative film and on an inner surface of the through hole or an inner surface of the blind via hole by applying a metal film-forming composition containing at least one of a salt of and a particle of a metal selected from Group 10 and Group 11 of the Periodic Table to the substrate or the electrically insulative film provided with the through hole or to the substrate or the electrically insulative film provided with the blind via hole becoming the through hole. Heating the coating film to form a metal film, the metal film-forming composition having a viscosity of 1 Pa's or less and a metal concentration of 5 to 50% by mass. Plating is performed by filling up the through hole or the blind via hole by depositing a conductor on the metal film by a plating process using the metal film as a seed layer. Removing an excess conductor deposited in the plating by a chemical mechanical polishing process.

According to another aspect of the present invention, a method for forming a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug includes forming a coating film on an upper surface of the substrate or the electrically insulative film and on an inner surface of the through hole or an inner surface of the blind via hole by applying a metal film-forming composition containing at least one of a salt of and a particle of a metal selected from Group 10 and Group 11 of the Periodic Table to the substrate or the electrically insulative film provided with the through hole or to the substrate or the electrically insulative film provided with the blind via hole becoming the through hole. Heating the coating film to 100 to 200° C. in an atmosphere with an oxygen concentration of 500 ppm or less or vacuum in the metal film formation to form a metal film. Plating is performed by filling up the through hole or the blind via hole by depositing a conductor on the metal film by a plating process using the metal film as a seed layer. Removing an excess conductor deposited in the plating by a chemical mechanical polishing process.

According to another aspect of the present invention, a method for forming a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug includes forming a coating film on an upper surface of the substrate or the electrically insulative film and on an inner surface of the through hole or an inner surface of the blind via hole by applying a metal film-forming composition containing at least one of a salt of and a particle of a metal selected from Group 10 and Group 11 of the Periodic Table to the substrate or the electrically insulative film provided with the through hole or to the substrate or the electrically insulative film provided with the blind via hole becoming the through hole. Heating the coating film to form a metal film having an average value of thickness on the inner wall of the through hole or the inner wall of the blind via hole of 10 to 2000 nm. Plating is performed by filling up the through hole or the blind via hole by depositing a conductor on the metal film by a plating process using the metal film as a seed layer. Removing an excess conductor deposited in the plating by a chemical mechanical polishing process.

According to another aspect of the present invention, a method for forming a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug includes forming a coating film on an upper surface of the substrate or the electrically insulative film and on an inner surface of the through hole or an inner surface of the blind via hole by applying a metal film-forming composition containing at least one of a salt of and a particle of a metal selected from Group 10 and Group 11 of the Periodic Table to the substrate or the electrically insulative film provided with the through hole or to the substrate or the electrically insulative film provided with the blind via hole becoming the through hole. Heating the coating film to form a metal film that is a sintered film of copper particles. Plating is performed by filling up the through hole or the blind via hole by depositing a conductor on the metal film by a plating process using the metal film as a seed layer. Removing an excess conductor deposited in the plating by a chemical mechanical polishing process.

According to another aspect of the present invention, a method for forming a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug includes forming a coating film on an upper surface of the substrate or the electrically insulative film and on an inner surface of the through hole or an inner surface of the blind via hole having an opening diameter of 1 to 100 μm and a depth of 20 to 200 μm and the ratio of the depth to the opening diameter ranges from 1 to 50 by applying a metal film-forming composition containing at least one of a salt of and a particle of a metal selected from Group 10 and Group 11 of the Periodic Table to the substrate or the electrically insulative film provided with the through hole or to the substrate or the electrically insulative film provided with the blind via hole becoming the through hole. Heating the coating film to form a metal film. Plating is performed by filling up the through hole or the blind via hole by depositing a conductor on the metal film by a plating process using the metal film as a seed layer. Removing an excess conductor deposited in the plating by a chemical mechanical polishing process.

According to another aspect of the present invention, a method for forming a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug includes forming a coating film on an upper surface of the substrate or the electrically insulative film and on an inner surface of the through hole or an inner surface of the blind via hole by applying a metal film-forming composition containing at least one of a salt of and a particle of a metal selected from Group 10 and Group 11 of the Periodic Table to the substrate or the electrically insulative film provided with the through hole or to the substrate or the electrically insulative film provided with the blind via hole becoming the through hole. Forming a high melting point film that serves as a base material of a barrier layer on an inner surface of the through hole or the blind via hole. Heating the coating film to form a metal film. Plating is performed by filling up the through hole or the blind via hole by depositing a conductor on the metal film by a plating process using the metal film as a seed layer. Removing an excess conductor deposited in the plating by a chemical mechanical polishing process.

According to another aspect of the present invention, a method for forming a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug includes forming a through hole or a blind via hole in the substrate or the electrically insulative film. A bottom seed layer is formed by depositing a conductor by a vapor phase deposition process on a lower end side of the through hole or on a bottom surface of the blind via hole. A coating film is formed covering an upper surface of the substrate or the electrically insulative layer, an inner wall of the through hole or the blind via hole, and an upper surface of the bottom seed layer by applying a metal film-forming composition containing at least one of a salt of and a particle of a metal selected from Group 10 and Group 11 of the Periodic Table to the substrate or the electrically insulative film provided thereon with the bottom seed layer. Heating the coating film to form a metal film. Plating is performed by filling up the through hole or the blind via hole by depositing a conductor on the metal film by a plating process using the metal film as a seed layer. Removing an excess conductor deposited in the plating by a chemical mechanical polishing process.

According to another aspect of the present invention, a method for forming a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug includes forming a through hole or a blind via hole in the substrate or the electrically insulative film. A bottom seed layer is formed by depositing a conductor by a vapor phase deposition process on a lower end side of the through hole or on a bottom surface of the blind via hole. A coating film is formed covering an upper surface of the substrate or the electrically insulative layer, an inner wall of the through hole or the blind via hole, and an upper surface of the bottom seed layer by applying a metal film-forming composition containing at least one of a salt of and a particle of a metal selected from Group 10 and Group 11 of the Periodic Table to the substrate or the electrically insulative film provided thereon with the bottom seed layer. Heating the coating film to form a metal film, the metal film-forming composition has a viscosity of 1 Pa·s or less and a metal concentration of 5 to 50% by mass. Plating is performed by filling up the through hole or the blind via hole by depositing a conductor on the metal film by a plating process using the metal film as a seed layer. Removing an excess conductor deposited in the plating by a chemical mechanical polishing process.

According to another aspect of the present invention, a method for forming a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug includes forming a through hole or a blind via hole in the substrate or the electrically insulative film. A bottom seed layer is formed by depositing a conductor by a vapor phase deposition process on a lower end side of the through hole or on a bottom surface of the blind via hole. A coating film is formed covering an upper surface of the substrate or the electrically insulative layer, an inner wall of the through hole or the blind via hole, and an upper surface of the bottom seed layer by applying a metal film-forming composition containing at least one of a salt of and a particle of a metal selected from Group 10 and Group 11 of the Periodic Table to the substrate or the electrically insulative film provided thereon with the bottom seed layer. Heating the coating film to 100 to 200° C. in an atmosphere with an oxygen concentration of 500 ppm or less or vacuum in the metal film formation to form a metal film. Plating is performed by filling up the through hole or the blind via hole by depositing a conductor on the metal film by a plating process using the metal film as a seed layer. Removing an excess conductor deposited in the plating by a chemical mechanical polishing process.

According to another aspect of the present invention, a method for forming a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug includes forming a through hole or a blind via hole in the substrate or the electrically insulative film. A bottom seed layer is formed by depositing a conductor by a vapor phase deposition process on a lower end side of the through hole or on a bottom surface of the blind via hole. A coating film is formed covering an upper surface of the substrate or the electrically insulative layer, an inner wall of the through hole or the blind via hole, and an upper surface of the bottom seed layer by applying a metal film-forming composition containing at least one of a salt of and a particle of a metal selected from Group 10 and Group 11 of the Periodic Table to the substrate or the electrically insulative film provided thereon with the bottom seed layer. Heating the coating film to form a metal film having an average value of thickness on the inner wall of the through hole or the inner wall of the blind via hole of 10 to 2000 nm. Plating is performed by filling up the through hole or the blind via hole by depositing a conductor on the metal film by a plating process using the metal film as a seed layer. Removing an excess conductor deposited in the plating by a chemical mechanical polishing process.

According to another aspect of the present invention, a method for forming a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug includes forming a through hole or a blind via hole in the substrate or the electrically insulative film. A bottom seed layer is formed by depositing a conductor by a vapor phase deposition process on a lower end side of the through hole or on a bottom surface of the blind via hole. A coating film is formed covering an upper surface of the substrate or the electrically insulative layer, an inner wall of the through hole or the blind via hole, and an upper surface of the bottom seed layer by applying a metal film-forming composition containing at least one of a salt of and a particle of a metal selected from Group 10 and Group 11 of the Periodic Table to the substrate or the electrically insulative film provided thereon with the bottom seed layer. Heating the coating film to form a metal film that is a sintered film of copper particles. Plating is performed by filling up the through hole or the blind via hole by depositing a conductor on the metal film by a plating process using the metal film as a seed layer. Removing an excess conductor deposited in the plating by a chemical mechanical polishing process.

According to another aspect of the present invention, a method for forming a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug includes forming a through hole or a blind via hole in the substrate or the electrically insulative film. A bottom seed layer is formed by depositing a conductor by a vapor phase deposition process on a lower end side of the through hole or on a bottom surface of the blind via hole. A coating film is formed covering an upper surface of the substrate or the electrically insulative layer, an inner wall of the through hole or the blind via hole having an opening diameter of 1 to 100 µm and a depth of 20 to 200 µm and the ratio of the depth to the opening diameter ranges from 1 to 50, and an upper surface of the bottom seed layer by applying a metal film-forming composition containing at least one of a salt of and a particle of a metal selected from Group 10 and Group 11 of the Periodic Table to the substrate or the electrically insulative film provided thereon with the bottom seed layer. Heating the coating film to form a metal film. Plating is performed by filling up the through hole or the blind via hole by depositing a conductor on the metal film by a plating process using the metal film as a seed layer. Removing an excess conductor deposited in the plating by a chemical mechanical polishing process.

According to another aspect of the present invention, a method for forming a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug includes forming a through hole or a blind via hole in the substrate or the electrically insulative film. A bottom seed layer is formed by depositing a conductor by a vapor phase deposition process on a lower end side of the through hole or on a bottom surface of the blind via hole. A coating film is formed covering an upper surface of the substrate or the electrically insulative layer, an inner wall of the through hole or the blind via hole, and an upper surface of the bottom seed layer by applying a metal film-forming composition containing at least one of a salt of and a particle of a metal selected from Group 10 and Group 11 of the Periodic Table to the substrate or the electrically insulative film provided thereon with the bottom seed layer. Forming a high melting point film that serves as a base material of a barrier layer on an inner surface of the through hole or the blind via hole. Heating the coating film to form a metal film. Plating is performed by filling up the through hole or the blind via hole by depositing a conductor on the metal film by a plating process using the metal film as a seed layer. Removing an excess conductor deposited in the plating by a chemical mechanical polishing process.

According to another aspect of the present invention, a method for forming a circuit arrangement comprising a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug includes forming a coating film on an upper surface of the substrate or the electrically insulative film and on an inner surface of the through hole or an inner surface of the blind via hole by applying a metal film-forming composition containing at least one of a salt of and a particle of a metal selected from Group 10 and Group 11 of the Periodic Table to the substrate or the electrically insulative film provided with the through hole or to the substrate or the electrically insulative film provided with the blind via hole becoming the through hole. Heating the coating film to form a metal film. Plating is performed by filling up the through hole or the blind via hole by depositing a conductor on the metal film by a plating process using the metal film as a seed layer. Removing an excess conductor deposited in the plating by a chemical mechanical polishing process.

According to another aspect of the present invention, a method for forming a circuit arrangement comprising a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug includes forming a through hole or a blind via hole in the substrate or the electrically insulative film. A bottom seed layer is formed by depositing a conductor by a vapor phase deposition process on a lower end side of the through hole or on a bottom surface of the blind via hole. A coating film is formed covering an upper surface of the substrate or the electrically insulative layer, an inner wall of the through hole or the blind via hole, and an upper surface of the bottom seed layer by applying a metal film-forming composition containing at least one of a salt of and a particle of a metal selected from Group 10 and Group 11 of the Periodic Table to the substrate or the electrically insulative film provided thereon with the bottom seed layer. Heating the coating film to form a metal film. Plating is performed by filling up the through hole or the blind via hole by depositing a conductor on the metal film by a plating process using the metal film as a seed layer. Removing an excess conductor deposited in the plating by a chemical mechanical polishing process.

According to another aspect of the present invention, a metal film-forming composition for a three-dimensional interconnection including at least one of a salt of and a particle of a metal selected from Group 10 and Group 11 of the Periodic Table.

According to another aspect of the present invention, a metal film-forming composition for a three-dimensional interconnection including at least one of a salt of and a particle of a metal selected from Group 10 and Group 11 of the Periodic Table, the salt of a metal is a carboxylic acid salt comprising copper or nickel and the particle of a metal is a copper particle or a nickel particle.

According to another aspect of the present invention, a metal film-forming composition for a three-dimensional interconnection including at least one of a salt of and a particle of a metal selected from Group 10 and Group 11 of the Periodic Table, the salt of a metal is copper formate or nickel formate and the particle of a metal is a copper particle or a nickel particle having an average particle diameter of 5 to 100 nm.

According to another aspect of the present invention, a metal film-forming composition for a three-dimensional interconnection including at least one of a salt of and a particle of a metal selected from Group 10 and Group 11 of the Periodic Table, and further comprising an amine compound.

According to another aspect of the present invention, a metal film-forming composition for a three-dimensional interconnection including at least one of a salt of and a particle of a metal selected from Group 10 and Group 11 of the Periodic Table, the composition having a viscosity of 1 Pas or less and a metal concentration of 5 to 50% by mass.

DETAILED DESCRIPTION OF THE EMBODIMENT

First Embodiment

Circuit Arrangement Comprising Three-Dimensional Interconnection

Figure 1A:
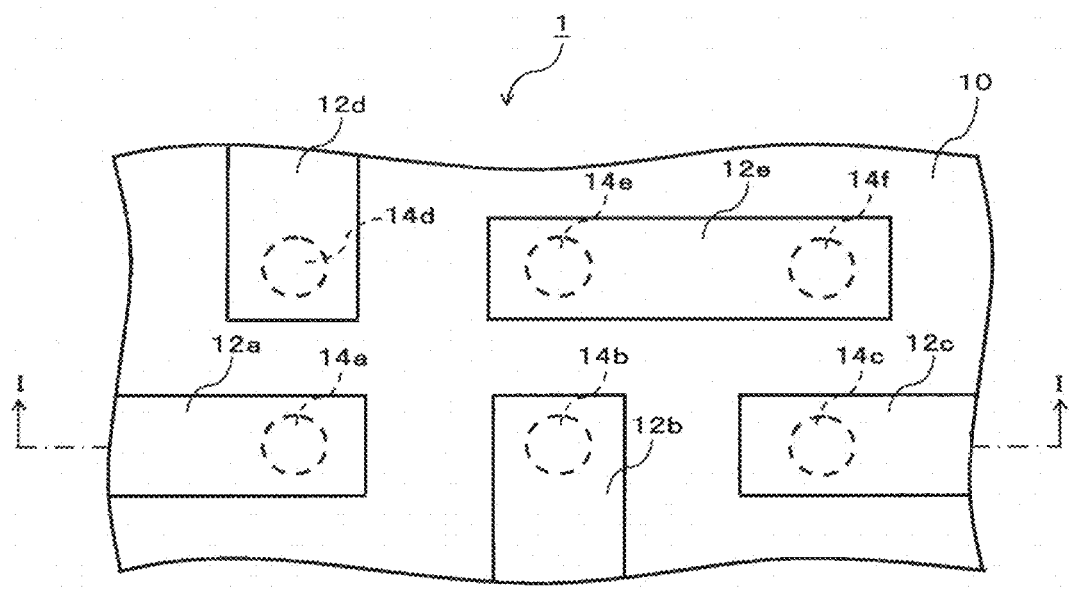
FIG. 1A is a schematic plane view illustrating the circuit arrangement comprising the three-dimensional interconnection according to the first embodiment.
Figure 1B:
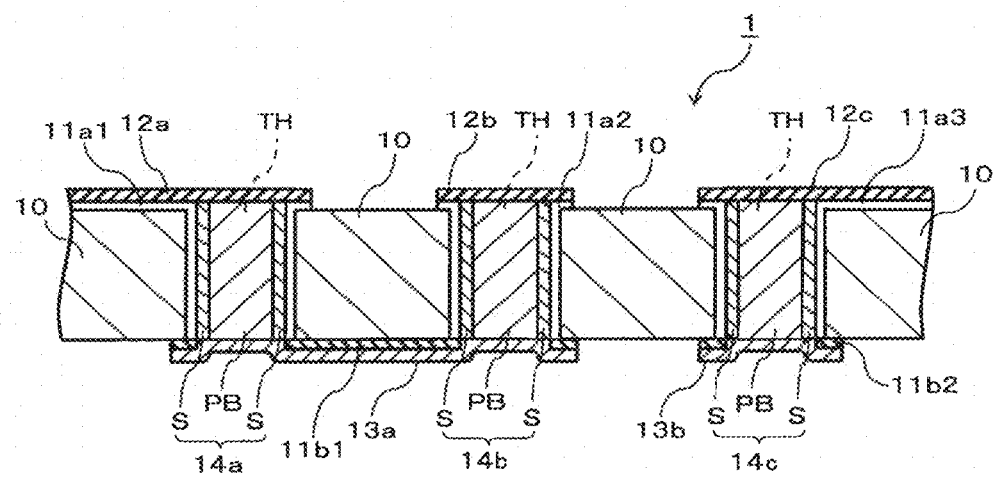
FIG. 1B is a cross-sectional view of FIG. 1A viewed along Line I-I.

FIG. 1A is a schematic plane view illustrating the circuit arrangement comprising a three-dimensional interconnection according to the first embodiment. FIG. 1B is a cross-sectional view of FIG. 1A viewed along Line I-I. The circuit arrangement having three-dimensional interconnections depicted in FIG. 1A and FIG. 1B is a through-silicon wiring board. Hereinafter, a description is made with the through-silicon wiring board designated as a referential numeral "1".

The through-silicon wiring board 1 has a silicon substrate 10, a plurality of upper wires formed via an upper barrier layer on the upper surface of the silicon substrate 10, a plurality of lower wires formed via a lower barrier layer on the lower surface of the silicon substrate 10, and a plurality of contact plugs each penetrating the silicon substrate 10 and electrically connecting a prescribed upper wire to a prescribed lower wire. Each upper barrier layer is the same in shape and size as the upper wire located thereabove in plan. Likewise, each lower barrier layer is the same in shape and size as the lower wire located therebelow in plan.

Five upper wires 12a to 12e are depicted in FIG. 1A, and three upper wires 12a to 12c and two lower wires 13a to 13b are depicted in FIG. 1B. Six contact plugs 14a to 14f are depicted in FIG. 1A, and three contact plugs 14a to 14c are depicted in FIG. 1B. An upper wire and a lower wire electrically connected to each other by a contact plug constitute one three-dimensional interconnection together with the contact plug.

As illustrated in FIG. 1B, each of the upper barrier layers 11a1 to 11a3 covers the inner wall of a through hole TH in which a corresponding contact plug 14a, 14b, or 14c is provided and the upper surface of silicon substrate 10, and each of the lower barrier layers 11b1 and 11b2 covers the lower surface of the silicon substrate 10. Each of the upper barrier layer 11a1 to 11a3 and the lower barrier layers 11b1 and 11b2 comprises at least one layer formed of, for example, a high melting point metal, an alloy of high melting point metals, and a compound of a high melting point metal and inhibits generation of electromigration from each of the upper wires 12a to 12e, each of the lower wires 13a to 13b, and each of the contact plugs 14a to 14f to the silicon substrate 10.

Specific examples of the material of each of the upper barrier layers 11a1 to 11a3 and the lower barrier layers 11b1 and 11b2 include a three-layer laminate film in which a titanium nitride film and a titanium film are laminated in order on a titanium film, a two-layer laminate film in which a titanium nitride film is laminated on a titanium film, a silicon oxide film, a titanium film, a tantalum film, a tantalum nitride film, and a tungsten nitride film. When the upper barrier layers 11a1 to 11a3 or the lower barrier layers 11*b*1 and 11*b*2 are formed from a silicon oxide film, the barrier layers can be formed by naturally oxidizing the surface of the silicon substrate 10. In FIG. 1B, the upper barrier layers 11*a*1 to 11*a*3 are depicted without hatching.

Each of the upper wires 12*a* to 12*e* and each of the lower wires 13*a* to 13*b* are made of, for example, metal such as copper, nickel, gold, silver, and aluminum, or an alloy comprising at least one of these metals, or a transparent conductive material such as ITO (indium•tin oxide), and methods for forming them may be chosen appropriately, e.g., a vapor phase deposition process.

Each of the contact plugs 14*a* to 14*c* has a seed layer S formed on the inner wall of a corresponding through hole TH via the upper barrier layer 11*a*1, 11*a*2, or 11*a*3, and a plug body PB that is formed on the seed layer S and fills up the through hole TH. The same applies to other contact plugs.

Each seed layer S is a metal film formed by heating a coating film made of a metal film-forming composition containing at least one of a salt of and a particle of a metal selected from Group 10 and Group 11 of the Periodic Table, and it extends from the lower end to the upper end of a corresponding through hole TH. The metal film-forming composition that serves as the material of the seed layer S is described in detail below.

The thickness of each seed layer S is preferably within the range of 10 to 2000 nm, in an average on the inner wall of a through hole TH, more preferably within the range of 30 to 50 nm. Preferably, each seed layer S is a sintered film of copper particles. The through hole TH on which the seed layer S is formed preferably has an opening diameter (an opening diameter attained when the formation of the upper barrier layers 11*a*1 to 11*a*3 or their base materials has finished) within the range of 1 to 100 μm, more preferably within the range of 4 to 100 nm, and a ratio of the depth to the opening diameter within the range of 1 to 50.

Each plug body PB is made of a conductor that is deposited on a seed layer S by a plating process and fills up a through hole TH. Each plug body PB may be made of, for example, a metal such as copper and nickel, or an alloy comprising at least one of these metals.

Since in the through-silicon wiring board 1, the above-describe constituents the plug body PB of each of the contact plugs 14*a* to 14*f* is formed by a plating process and the upper wires 12*a* to 12*e* are electrically connected to the prescribed lower wires by these contact plugs 14*a* to 14*f*, the electrical conductivity of the three-dimensional interconnection which the through-silicon wiring board 1 has is good.

The coating film of the metal film-forming composition described above has good step coverage and a metal film almost uniform in film thickness from the lower end side to the upper end side of a through hole TH can easily be formed therefrom. For this reason, when a plug body PB is formed by a plating process, the difference between a time required to form the lower end side of the plug body PB and a time required to form the upper end side can be decreased. As a result, there can reduce the possibility to reach a situation that a plating film deposits excessively on the upper surface side of the silicon substrate 10 during the formation of the plug body PB and the removal thereof requires a long time, or a situation that a takt time increases during the removal of a plating film deposited on the upper surface side of the silicon substrate 10 by a chemical mechanical polishing (CMP) process, or the like. Moreover, generating of voids inside the plug body PB is inhibited.

Therefore, the through-silicon wiring board 1 is easy to produce at a relatively high productivity at a relatively low production cost.

Hereinafter, an embodiment of a method for forming a three-dimensional interconnection is explained by way of taking a method for producing a through-silicon wiring board 1 as an example with reference to FIGS. 2A to 2D and FIGS. 3A to 3E.

Method for Forming Three-Dimensional Interconnection

FIG. 2A to FIG. 2D are, respectively, cross-sectional views schematically illustrating a step for producing the through-silicon wiring board illustrated in FIG. 1A and FIG. 1B. FIG. 3A to FIG. 3E are, respectively, cross-sectional views schematically illustrating a step performed after the step illustrated in FIG. 2D.

Figure 2A:
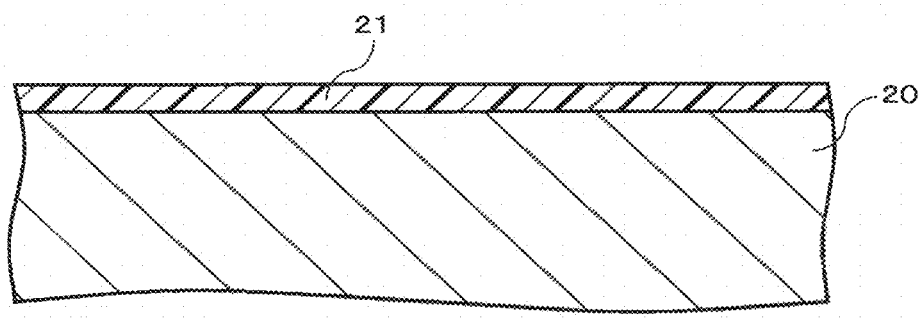
FIG. 2A is a cross-sectional view schematically illustrating a step for producing the circuit arrangement (through-silicon wiring board) comprising the three-dimensional interconnection illustrated in FIG. 1A and FIG. 1B.

As illustrated in FIG. 2A, in producing a through-silicon wiring board 1 depicted in FIG. 1A and FIG. 1B, a mask material layer 21 is first formed on the upper surface of a base material 20 that will eventually be processed into a silicon substrate 10 (see FIG. 1A and FIG. 1B). The material of this mask material layer 21 is suitably chosen depending upon whether blind via holes described below will be formed by a wet etching process or whether the blind via holes will be formed by a wet etching process. When the blind via holes will be formed by a wet etching process, an organic positive type resist layer or an organic negative resist layer may be used as the mask material layer 21. When the blind via holes will be formed by a dry etching process, a silicon nitride film formed by, for example, a plasma CVD process may be used as the mask material layer 21.

Figure 2B:
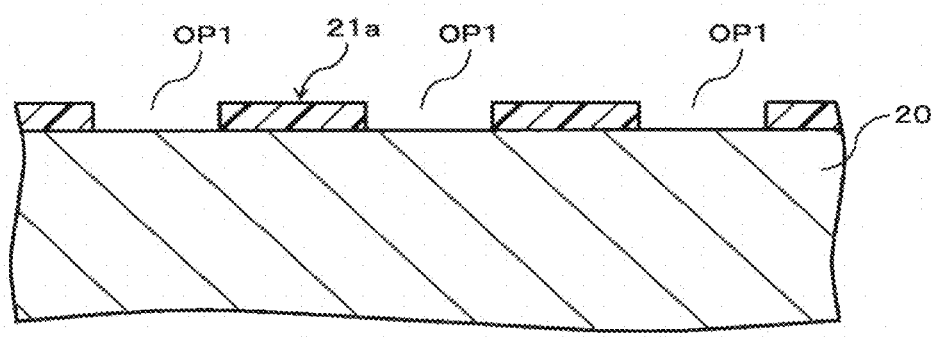
FIG. 2B is a cross-sectional view schematically illustrating a step for producing the circuit arrangement (through-silicon wiring board) comprising the three-dimensional interconnection illustrated in FIG. 1A and FIG. 1B.

Subsequently, the mask material layer 21 is patterned by a lithography process or the like to obtain an etching mask 21*a* in which openings OP1 have been formed at a plurality of predetermined positions as depicted in FIG. 2B. The positions where the individual openings OP1 are formed correspond to the positions where the through holes TH depicted in FIG. 1B are to be formed.

Figure 2C:
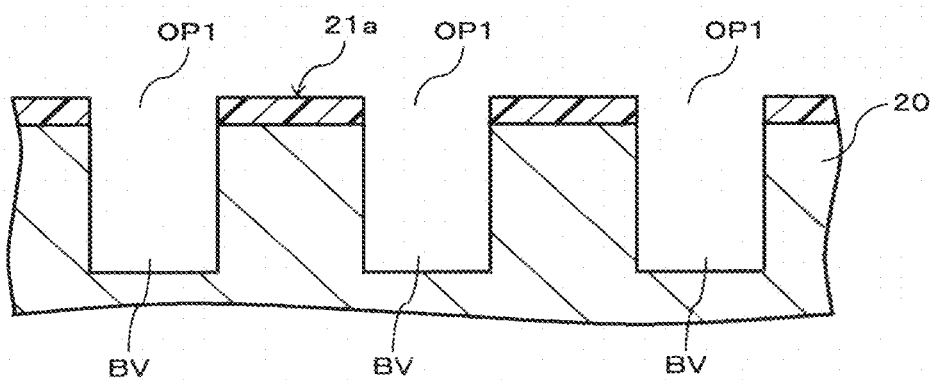
FIG. 2C is a cross-sectional view schematically illustrating a step for producing the circuit arrangement (through-silicon wiring board) comprising the three-dimensional interconnection illustrated in FIG. 1A and FIG. 1B.

Next, the base material 20 is etched from the upper surface side of the base material 20 by, for example, a reactive ion etching process to form blind via holes BV at a plurality of positions of the base material 20 as illustrated in FIG. 2C. Preferably, the individual blind via holes BV are formed to have an opening diameter of 1 to 100 μm, a depth of 20 to 200 μm, and an aspect ratio (a ratio of the depth to the opening diameter) of 1 to 50. The etching mask 21*a* is removed after the formation of the blind via holes By.

Figure 2D:
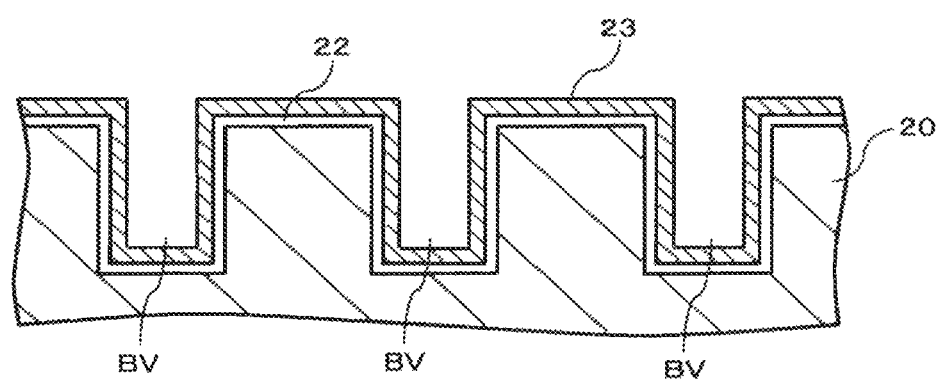
FIG. 2D is a cross-sectional view schematically illustrating a step for producing the circuit arrangement (through-silicon wiring board) comprising the three-dimensional interconnection illustrated in FIG. 1A and FIG. 1B.

Next, a high melting point film for an upper barrier layer that will serve as a base material of an upper barrier layer is formed by a PVD process or a CVD process on the upper surface of the base material 20 and the inner surfaces of the individual blind via holes BV, and then the metal film-forming composition described above is applied by a spin coating process, a printing process, or the like to form a coating film, and then the coating film is heated to form a metal film. As illustrated in FIG. 2D, on the upper surface of the base material 20 and the inner surfaces of the individual blind via holes BV, the high melting point film 22 for an upper barrier layer and the metal film 23 are stacked in order.

Figure 3A:
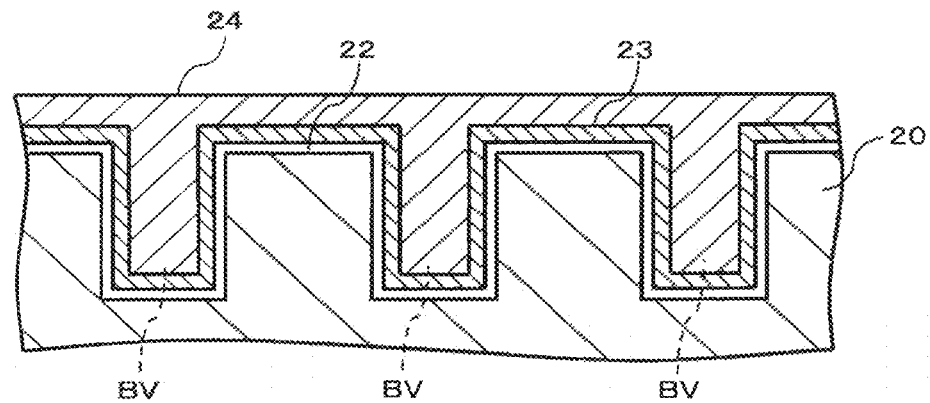
FIG. 3A is a cross-sectional view schematically illustrating a step performed after the step illustrated in FIG. 2D.
Figure 3B:
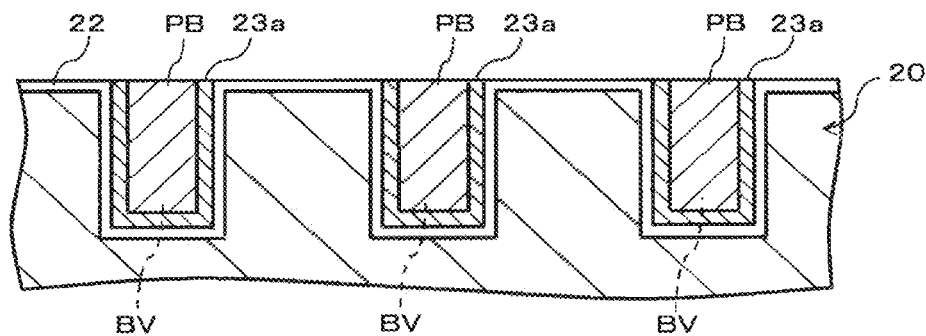
FIG. 3B is a cross-sectional view schematically illustrating a step performed after the step illustrated in FIG. 2D.

The high melting point film 22 for an upper barrier layer corresponds to a base material of the individual upper barrier layers 11*a*1 to 11*a*3 depicted in FIG. 1B and, for example, a high melting point film comprising at least one layer made of a high melting point metal an alloy of high melting point metals, or a compound of a high melting point metal, specifically, a high melting point film, such as a three-layer laminate film in which a titanium nitride film and a titanium film are stacked in order on a titanium film, a two-layer laminate film in which a titanium nitride film is stacked on a titanium film, a silicon oxide film, a titanium film, a tantalum film, a tantalum nitride film, and a tungsten nitride film, can be formed by a PVD process, a CVD process, or the like. In FIG. 2D as well as FIG. 3A and FIG. 3B, provided below, the high melting point film 22 for an upper barrier layer is depicted without hatching.

The metal film 23 corresponds to a base material of the seed layer S depicted in FIG. 1B. The metal film 23 has good step coverage. In forming the metal film 23, it is preferred that the viscosity of the metal film-forming composition at the time of its application be adjusted to 1 Pa-s or less and the metal concentration be adjusted to 5 to 50% by mass, and it is preferred to perform the heating of a coating film at 100 to 200° C. in an atmosphere with an oxygen concentration of 500 ppm or less or in a vacuum. It is preferred to adjust the applied amount so that the average of the thickness of the metal film 23 on the inner walls of blind via holes BV may fall within the range of 10 to 2000 nm. Preferably, the metal film 23 is a sintered film of copper particles.

Next, a conductor layer 24 is formed by depositing a conductor such as copper on the entire outer surface of the metal film 23 by a plating process. As illustrated in FIG. 3A, the formation of the conductor layer 24 is performed until each blind via hole BV is filled up with the conductor layer 24. The conductor layer 24 serves as a base material of each plug body PB depicted in FIG. 1B.

Subsequently, the step of polishing away, by a chemical mechanical polishing (CMP) process or the like, regions formed on the upper surface side of the base material 20 is performed for each of the metal film 23 and the conductor layer 24. By carrying out the step, the regions of the metal film 23 located on the upper surface side of the base material 20 are removed as illustrated in FIG. 3B and thereby the metal film 23 becomes a polished metal film 23a, and the plug bodies PB of the individual contact plugs 14a to 14f depicted in FIG. 1A are formed from the conductor layer 24.

Figure 3C:
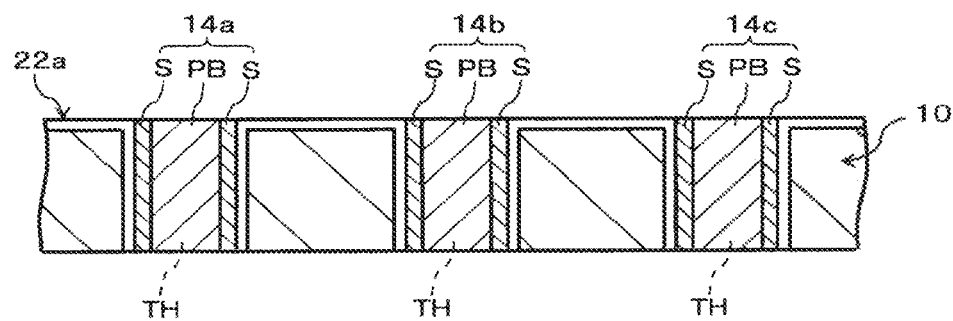
FIG. 3C is a cross-sectional view schematically illustrating a step performed after the step illustrated in FIG. 2D.

Subsequently, the base material 20 is polished from the lower surface side of the base material 20 and thereby the thickness thereof is reduced. This polishing is performed until the lower ends of the plug bodies PB are completely exposed as depicted in FIG. 3C. By this polishing, the base material 20 becomes a silicon substrate 10 depicted in FIG. 1B. By the polishing treatment, regions of the high melting point film 22 for an upper barrier layer, the regions having been located on the bottom surfaces of blind via holes BV, and certain regions above the regions are also removed and thereby the high melting point film 22 for an upper barrier layer becomes a polished high melting point film 22a for an upper barrier layer.

Moreover, by the polishing treatment described above, regions of the polished metal film 23a, the regions having been located on the bottom surfaces of blind via holes BV, and certain regions above the regions are also removed and thereby the individual seed layers S depicted in FIG. 1B are formed from the polished metal film 23. The blind via holes BV become through holes TH depicted in FIG. 1B. As a result, the individual contact plugs 14a to 14f depicted in FIG. 1A are formed.

Figure 3D:
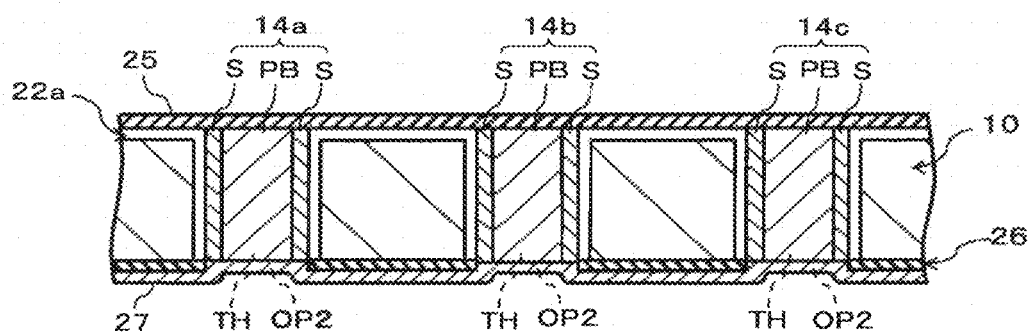
FIG. 3D is a cross-sectional view schematically illustrating a step performed after the step illustrated in FIG. 2D.

Next, as illustrated in FIG. 3D, a conductor film 25 for an upper wire is formed on the upper surface of the silicon substrate 10 and a high melting point film that serves as a base material of the lower barrier layers 11b1 and 11b2 illustrated in FIG. 1B is formed on the lower surface of the silicon substrate, and then the high melting point film is patterned into a desired shape and thereby a high melting point film 26 for a lower barrier layer is formed. Thereafter, a conductor film 27 for a lower wire is formed on the entire lower surface side of the silicon substrate 10.

The conductor film 25 for an upper wire may be made of, for example, metal such as copper, nickel, gold, silver, and aluminum, or an alloy comprising at least one of these metals, or a transparent conductive material such as ITO (indium•tin oxide), and methods for forming them may be chosen appropriately, e.g., a vapor phase deposition process.

The high melting point film 26 for a lower barrier layer has openings OP2 in which lower end surfaces of the individual contact plugs 14a to 14f are exposed. In the same fashion as the high melting point film 22 for an upper barrier layer, the high melting point film 26 for lower barrier layers can be formed by forming a high melting point film comprising at least one layer made of a high melting point metal, an alloy of high melting point metals, or a compound of a high melting point metal on the entire lower surface of the silicon substrate 10 by a PVD process, a CVD process, or the like, and then patterning the high melting point film by a lithography process, thereby forming the above-mentioned openings OP2 at predetermined positions. It is also possible to form a high melting point film 26 for a lower barrier layer by naturally oxidizing the lower surface of the silicon substrate 10.

The conductor film 27 for a lower wire may be made of, for example, metal such as copper, nickel, gold, silver, and aluminum, or an alloy comprising at least one of these metals, or a transparent conductive material such as ITO (indium•tin oxide), and methods for forming them may be chosen appropriately, e.g., a vapor phase deposition process. The conductor film 27 for a lower wire covers the high melting point film 26 for a lower barrier layer and the lower end surfaces of the individual contact plugs 14a to 14f.

In the case where a naturally oxidized film has been formed on the upper end surfaces of the individual contact plugs 14a to 14f during a period from the completion of the formation of the individual contact plugs 14a to 14f to the completion of the formation of the conductor film 25 for an upper wire, it is preferred to form the conductor film 25 for an upper wire after removing the naturally oxidized film by wet etching, or the like. The same applies to the case where a naturally oxidized film has been formed on the lower end surfaces of the individual contact plugs 14a to 14f during a period from the completion of the formation of the individual contact plugs 14a to 14f to the completion of the formation of the conductor film 27 for a lower wire.

Subsequently, a resist layer is formed from an organic resist material on the upper surface of the conductor film 25 for an upper wire, and then the resist layer is patterned by, for example, a wet etching process to obtain an etching mask in which an opening is formed at each of a plurality of predetermined positions. The positions where the individual openings are formed correspond to positions excluding the positions where the upper wires 12a to 12e depicted in FIG. 1A.

Figure 3E:
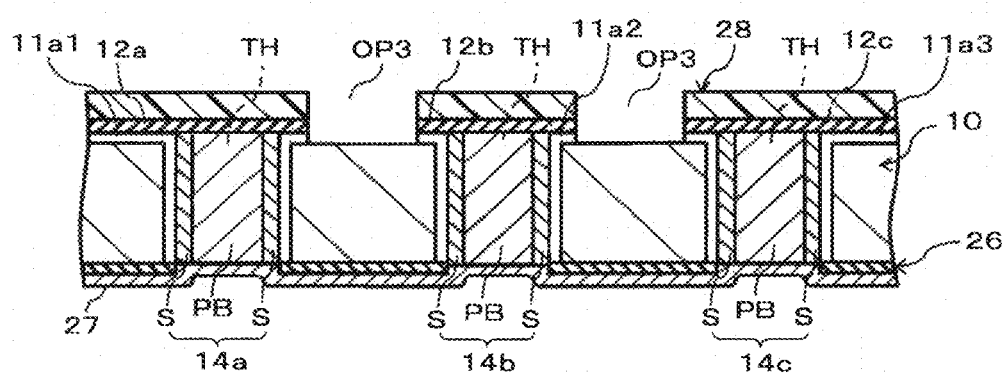
FIG. 3E is a cross-sectional view schematically illustrating a step performed after the step illustrated in FIG. 2D.

Next, the conductor film 25 for an upper wire and the polished high melting point film 22a for an upper barrier layer located thereunder are etched by, for example, a wet etching process from the upper surface side of the conductor film 25 for an upper wire. At this time, as illustrated in FIG. 3E, a region that has located under an opening OP3 of an etching mask 28 of the conductor films 25 for an upper wire and a region that has located under an opening OP3 of the polished high melting point film 22a for an upper barrier layer are etched away. By this etching, the individual upper wires 12a to 12e depicted in FIG. 1A are formed and upper barrier layers that intervene between the individual upper wires 12a to 12e and the silicon substrate 10 are formed. In FIG. 3E, there are depicted three upper wires 12a to 12c and three upper barrier layers 11a1 to 11a3 that are depicted in FIG. 1B.

Then, the conductor film 27 for a lower wire and the high melting point film 26 for a lower barrier layer are etched in the same way as the etching of the conductor film 25 for an upper wire to form a prescribed number of lower wires and lower barrier layers. By forming the lower wires and the lower barrier layers, the through-silicon wiring board 1 with three-dimensional interconnections illustrated in FIG. 1A and FIG. 1B is obtained.

If three-dimensional interconnections are formed as described above, a three-dimensional interconnection having good electrical conductivity can be formed in a relatively high productivity and in a relatively low production cost as described in the explanation about the through-silicon wiring board 1.

Second Embodiment

Circuit Arrangement Comprising Three-Dimensional Interconnection

Figure 4A:
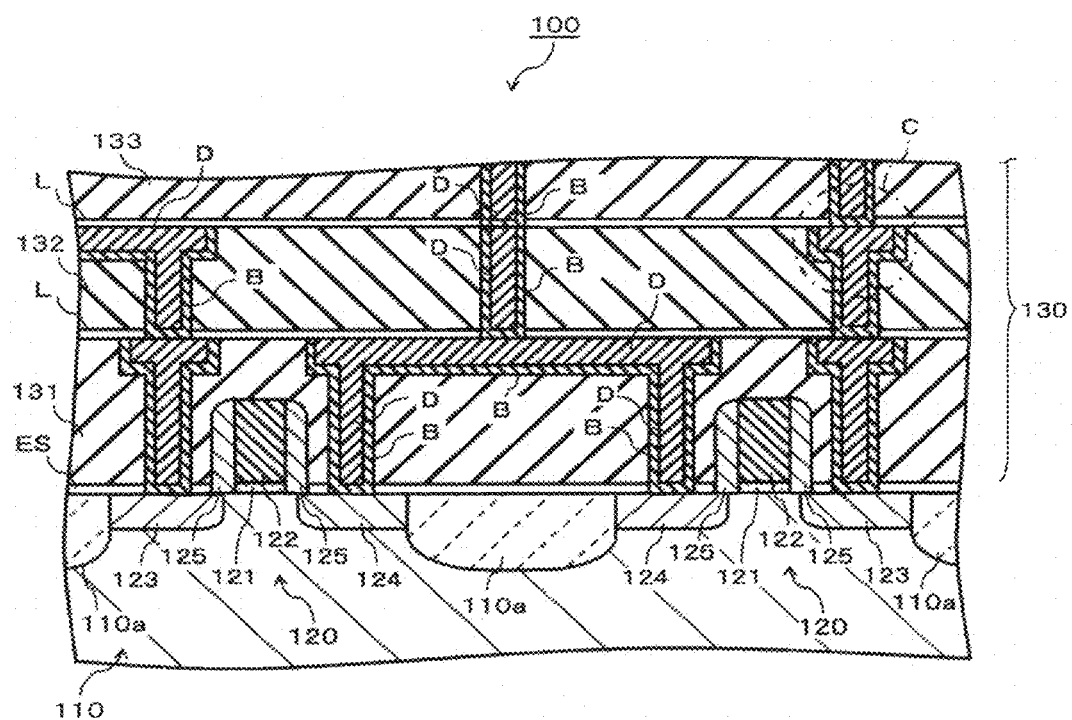
FIG. 4A is a plane view schematically illustrating the circuit arrangement comprising the three-dimensional interconnection according to the second embodiment.
Figure 4B:
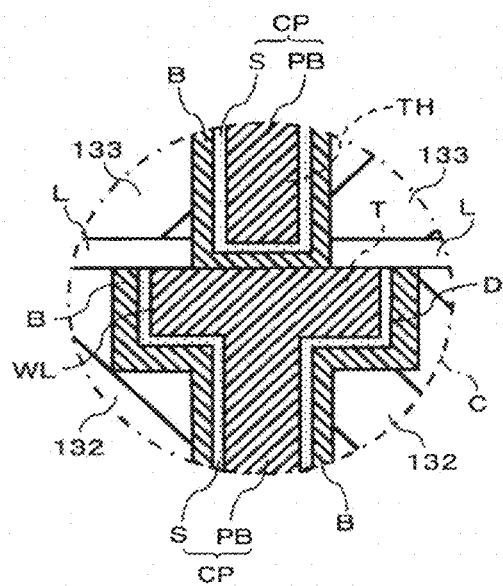
FIG. 4B is a cross-sectional view of FIG. 4A viewed along Line I-I.

FIG. 4A is a cross-sectional view schematically illustrating the circuit arrangement comprising the three-dimensional interconnection according to the second embodiment. FIG. 4B is an expanded view of the region enclosed by the dot-dash line (Circle C) as seen in FIG. 4A. The circuit arrangement having three-dimensional interconnections depicted in FIG. 4A is a semiconductor device. Hereinafter, a description is made with the semiconductor device designated as a referential numeral "100".

The semiconductor device 100 depicted in FIG. 4A comprises a semiconductor substrate 110, a plurality of circuit elements formed on the semiconductor substrate 110, and a multilevel interconnection 130 formed on the semiconductor substrate 110 to covered these circuit elements. In FIG. 4A, two field effect transistors 120 are depicted as the above-mentioned circuit elements. Hereinafter, the individual components of the semiconductor device 100 are explained.

The semiconductor substrate 110 is a silicon single crystal substrate in which isolation regions 110a for electrically isolating circuit elements arranged adjacent to each other are formed in a predetermined pattern. A substrate made of a compound semiconductor such as gallium arsenide or an SOI (Silicon On Insulator) substrate can also be used instead of the silicon single crystal substrate. A plurality of circuit elements formed on a semiconductor substrate 110 constitute an integrated circuit together with a multilevel interconnection 130 formed on the semiconductor substrate 110, and the type and the number of circuit elements to be formed on the semiconductor substrate 110 are chosen appropriately according to the function required of the semiconductor device 100, the application of the semiconductor device 100, etc.

Each field effect transistor 120 comprises a gate electrode 122 disposed via a gate dielectric film 121 on a semiconductor substrate 110, a source region 123 and a drain region 124 which are formed on the semiconductor substrate 110, and sidewall spacers 125 formed on both sides in a line width direction of the gate electrode 122. In FIG. 4A, the gate dielectric film 121 is smudged.

The multilevel interconnection 130 has a plurality of wiring layers stacked via an etching stopper film ES on the semiconductor substrate 110, and a liner layer L intervening between two vertically adjacent wiring layers. In FIG. 4A, three layers in total, the first wiring layer 131 to the third wiring layer 133 are depicted. In FIG. 4A, the etching stopper film ES and each liner layer L are depicted without hatching.

The etching stopper film ES is formed from, for example, silicon carbon nitride or silicon nitride and is used as an etching stopper at the time of providing a through hole (contact hole) in an electrically insulative layer that serves as a base material of the first wiring layer 131. Preferably, each liner layer L is formed from a material differing from the base material of the wiring layer that serves as the base of the liner layer L. For example, in the case of having used silicon oxide as a base material of a wiring layer, it is preferred to form a liner layer made of, for example, silicon carbon nitride or the like on the wiring layer formed from the base material.

Each of the wiring layers 131 to 133 has a barrier layer B that covers the inner surfaces of trenches and through holes in a predetermined pattern formed by a wet etching process or a dry etching process in an electrically insulative layer that serves as a base material and also covers an underlayer exposed to the lower openings of the through holes, and a damascene wire D that is formed on the barrier layer B and fills up each of the trenches and through holes. The electrically insulative layer may be formed, for example of silicon oxide, silicon nitride, a low-κ dielectric, or the like. In the same fashion as the upper barrier layers 11a1 to 11a3 depicted in FIG. 1B, the barrier layer B comprises at least one layer made of, for example, a high melting point metal, an alloy of high melting point metals, or a compound of a high melting point metal.

As illustrated in FIG. 4B, each damascene wire D has a seed layer S formed on a barrier layer B and a conductor that is formed on the seed layer S to fill up a trench T and a through hole TH. In the conductor, a region filling up the trench T serves a wire WL and a region filling up the through hole TH serves as a contact plug body PB of a contact plug CP. The contact plug CP has a region of the seed layer S formed in the through hole TH and the plug body PB.

In the same fashion as the seed layer S depicted in FIG. 1B, the seed layer S that constitutes the damascene wire D is a metal film formed by heating a coating film of a metal film-forming composition containing at least one of a salt of and a particle of a metal selected from Group 10 and Group 11 of the Periodic Table. The thickness of each seed layer S is preferably within the range of 10 to 2000 nm, in an average on the inner wall of a through hole TH. Preferably, each seed layer S is a sintered film of copper particles. The through hole TH on which the seed layer S is formed preferably has an opening diameter (an opening diameter attained when the formation of the barrier layers B or their base materials has finished) within the range of 1 to 100 μm, and a ratio of the depth to the opening diameter within the range of 1 to 50. The conductor that constitutes the plug body PB and the wire WL is deposited on the seed layer S by a plating process. As this conductor, copper can be used, for example.

The contact plug CP formed in the first wiring layer 131 is electrically connected to a source region 123 or a drain region 124 of a field effect transistor 120 via a certain region of a barrier layer B formed in the first the wiring layer 131. Likewise, contact plugs formed in each of the second wiring layer 132 and the third wiring layer 133 are electrically connected to a damascene wire D formed in the first wiring layer 131 or the second wiring layer 132 located directly thereunder via certain regions of the barrier layer B formed in the wiring layers 132, 133. For each contact plug CP, the wire WL integrally formed on the upper end side of the contact plug CP corresponds to an upper wire, and the wire WL or other contact plug CP electrically connected via a barrier layer B on the lower end side of the contact plug CP corresponds to a lower wire. Many three-dimensional interconnections are formed in the multilevel interconnection 130.

Since in the semiconductor device 100, in which the above-mentioned components are included, the three-dimensional interconnection is formed by the damascene wire D, thus the electrical conductivity of the three-dimensional interconnection of the semiconductor device 100 is good. The coating film of the above-mentioned metal film-forming composition which is used as the material of the seed layer S constituting the damascene wire D, has good step coverage and a metal film almost uniform in film thickness from the lower end side to the upper end side of a through hole TH can easily be formed therefrom. For this reason, when a plug body PB is formed by a plating process, the difference between a time required to form the lower end side of the plug body PB and a time required to form the upper end side can be decreased. As a result, there can reduce the possibility to reach a situation that a plating film deposits excessively on the upper surface side of the wiring layer during the formation of damascene wire D and the removal thereof requires a long time, or a situation that a takt time increases during the removal of a plating film deposited on the upper surface side of the wiring layer by a chemical mechanical polishing (CMP) process, or the like. Moreover, generating of voids inside the plug body PB is inhibited.

Therefore, in the semiconductor device 100 the multilevel interconnection 130 is easy to produce at a relatively high productivity at a relatively low production cost. As a result, the semiconductor device 100 is easy to produce at a relatively high productivity at a relatively low production cost.

Hereinafter, another embodiment of a method for forming a three-dimensional interconnection is explained by way of taking a method for producing a semiconductor device 100 as an example with reference to FIGS. 5A to 5C and FIGS. 6A to 6C.

Figure 5A:
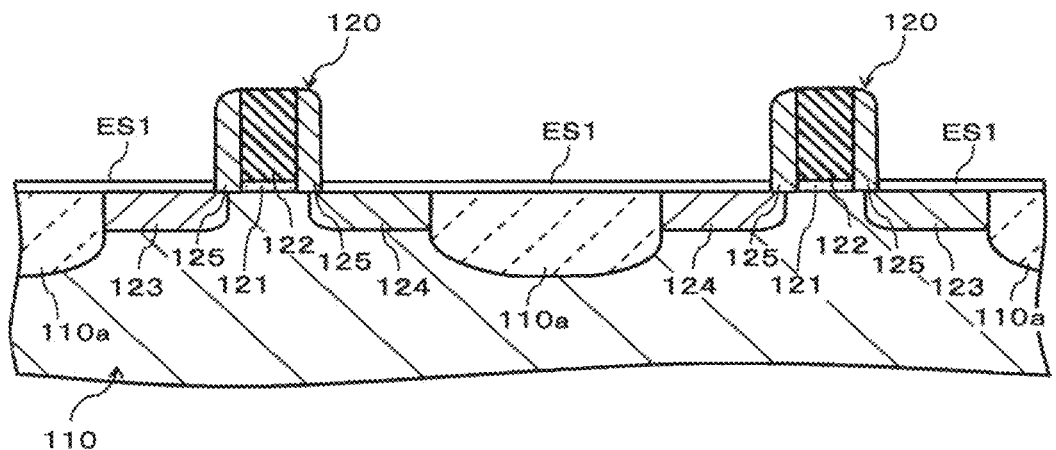
FIG. 5A is a cross-sectional view schematically illustrating a step for producing the circuit arrangement (through-silicon wiring board) comprising the three-dimensional interconnection illustrated in FIG. 4A and FIG. 4B.
Figure 5B:
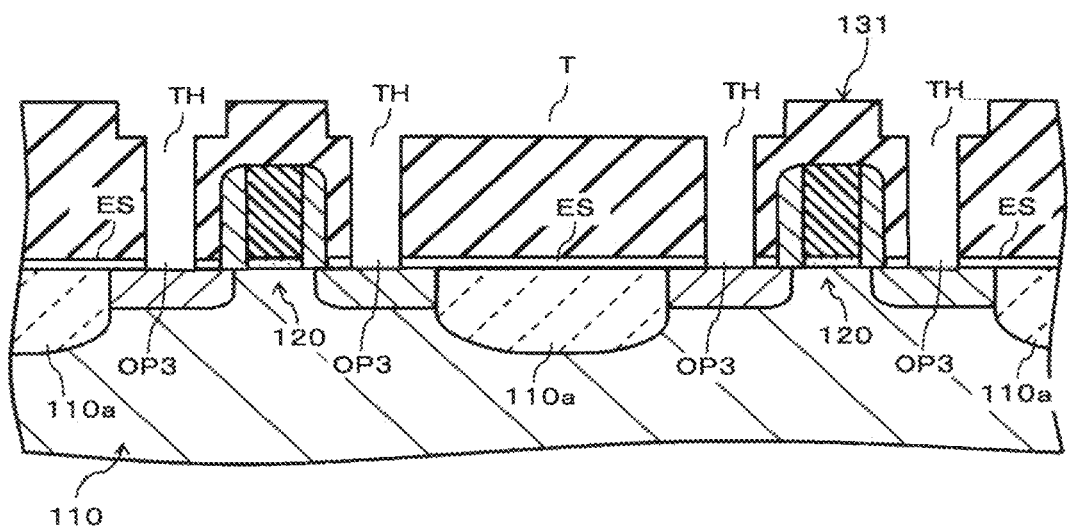
FIG. 5B is a cross-sectional view schematically illustrating a step for producing the circuit arrangement (through-silicon wiring board) comprising the three-dimensional interconnection illustrated in FIG. 4A and FIG. 4B.
Figure 5C:
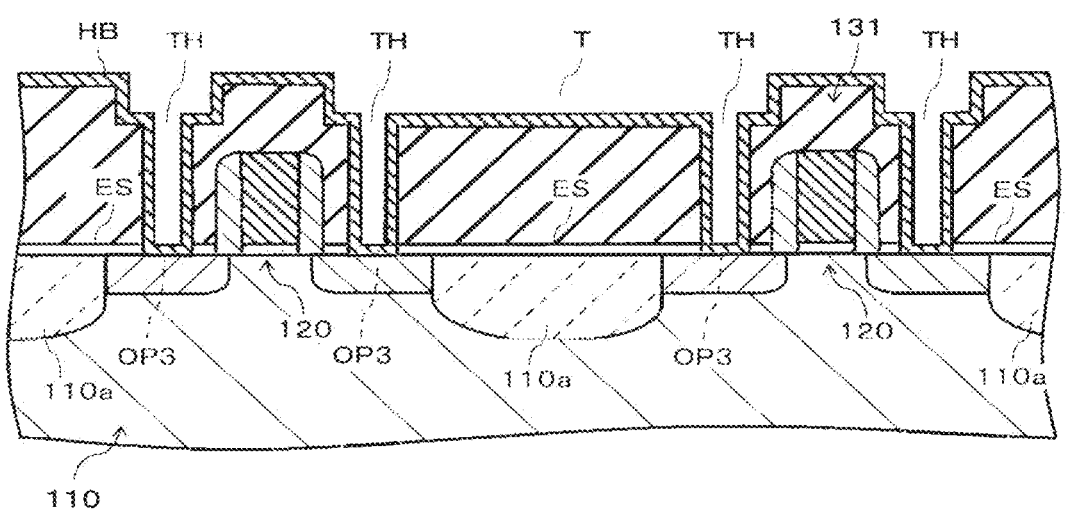
FIG. 5C is a cross-sectional view schematically illustrating a step for producing the circuit arrangement (through-silicon wiring board) comprising the three-dimensional interconnection illustrated in FIG. 4A and FIG. 4B.
Figure 6A:
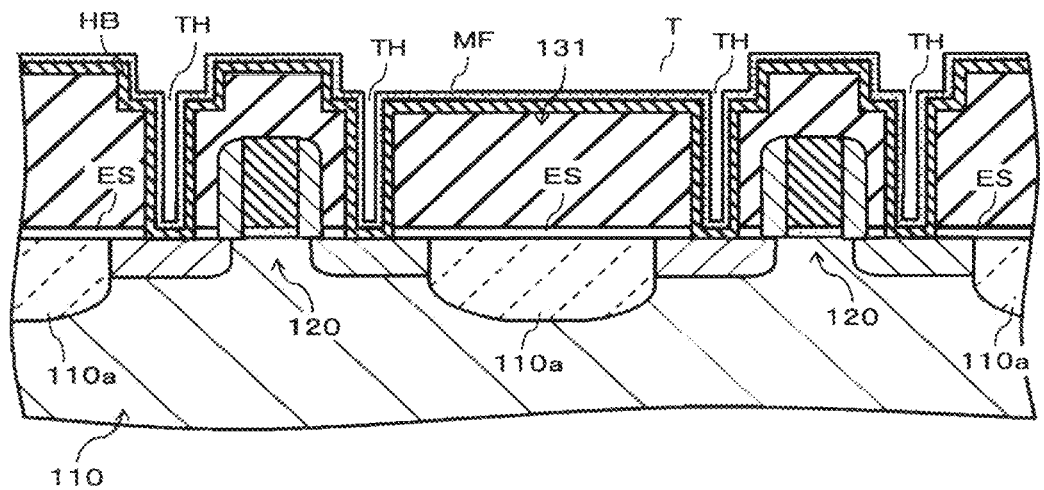
FIG. 6A is a cross-sectional view schematically illustrating a step performed after the step illustrated in FIG. 5C.
Figure 6B:
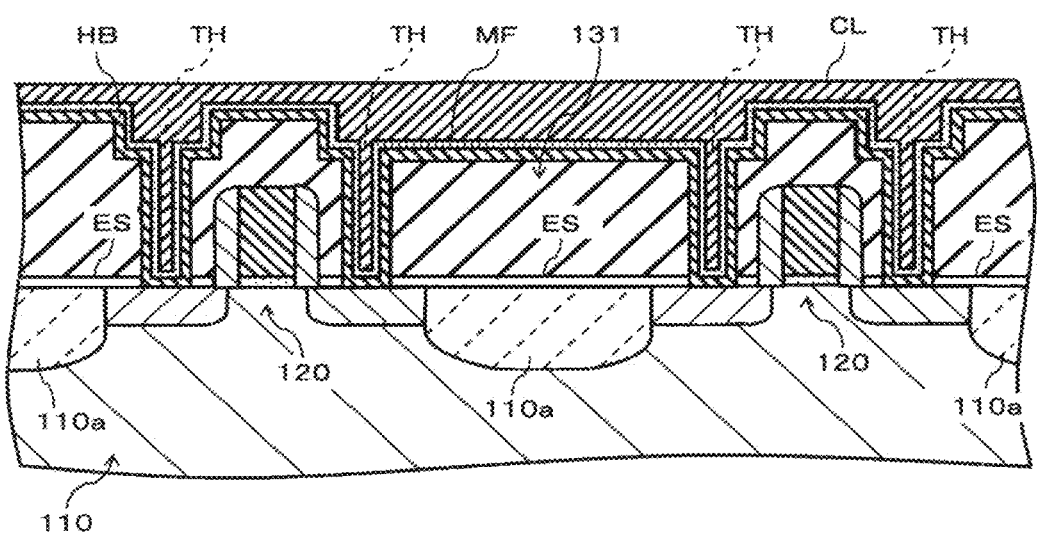
FIG. 6B is cross-sectional view schematically illustrating a step performed after the step illustrated in FIG. 5C.
Figure 6C:
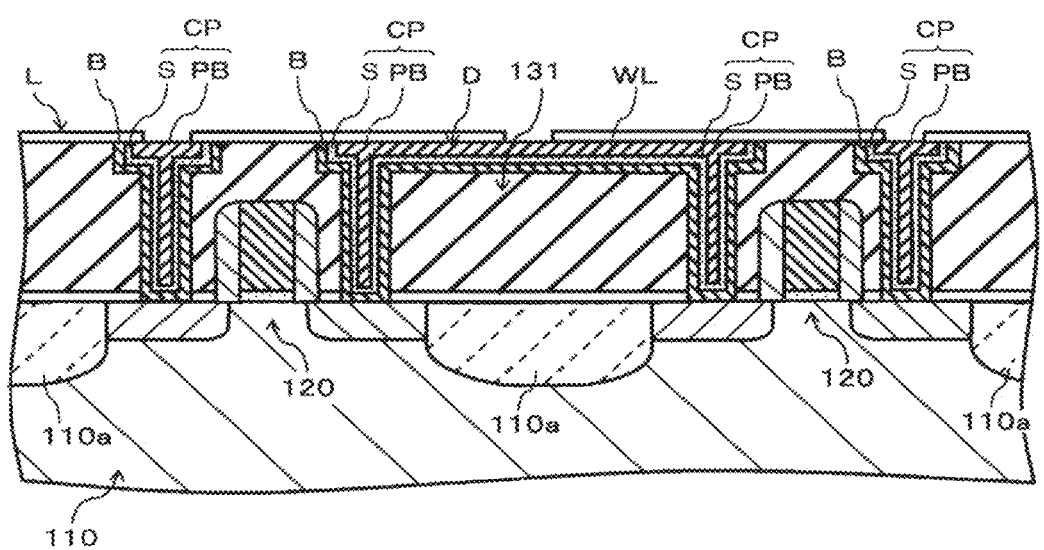
FIG. 6C is cross-sectional view schematically illustrating a step performed after the step illustrated in FIG. 5C.

FIG. 5A to FIG. 5C are, respectively, cross-sectional views schematically illustrating a step for producing the semiconductor device illustrated in FIG. 4A and FIG. 4B. FIG. 6A to FIG. 6C are, respectively, cross-sectional views schematically illustrating a step performed after the step illustrated in FIG. 5C.

As illustrated in FIG. 5A, in manufacturing a semiconductor device 100 depicted in FIG. 4A and FIG. 4B, a first etching stopper film ES1, which is a base material of the etching stopper film ES depicted in FIG. 4A, is formed first by a PVD process or a CVD process on a semiconductor substrate 110 on which a desired circuit element such as a field effect transistor 120 has been formed. The first etching stopper film ES1 may be formed so as to cover a gate electrode 122 of each field effect transistor 120 and the individual sidewall spacer 125. In FIG. 5A, the first etching stopper film ES1 is depicted without hatching.

Next, an electrically insulative layer that serves as a base material of the first wiring layer 131 is formed on a semiconductor substrate 110 by a PVD process or a CVD process and an etching mask in a predetermined shape is formed thereon, and then the electrically insulative layer is formed by a wet etching process or a dry etching process. Thus, a first wiring layer having trenches and through holes in a predetermined pattern is obtained. Then, the first etching stopper film ES1 is etched using the above-described etching mask as it is, thereby removing a region located under a through hole provided in the first wiring layer 131. Thus, the first etching stopper film ES1 is processed into the etching stopper film ES depicted in FIG. 4A.

FIG. 5B illustrates the first wiring layer 131 and the etching stopper film ES formed as described above. In the first wiring layer 131, a prescribed number of trenches T and through holes TH have been formed. In the etching stopper film ES, openings OP3 have been formed at the regions located under through holes TH provided in the first wiring layer 131.

Subsequently, a high melting point film is formed, for example, by a CVD process, and thereby a high melting point film HB for a barrier layer is formed as illustrated in FIG. 5C, the high melting point film covering the upper surface of the first wiring layer 131, the inner surface of the trench T, the inner surface of the through hole TH, the inner wall of the opening OP3 in the etching stopper film ES, and the surface of the semiconductor substrate 110 exposed from the opening OP3. The material high melting point film HB for a barrier layer may be, for example, the same material as that of the individual upper barrier layers 11a1 to 11a3 depicted in FIG. 1B.

Next, the aforementioned metal film-forming composition is applied onto the high melting point film HB for a barrier layer by a spin coating process, a printing process, or the like to form a coating film, and then the coating film is heated to form a metal film MF on the high melting point film HB for a barrier layer as illustrated in FIG. 6A. The metal film MF has good step coverage.

In forming the metal film MF, it is preferred that the viscosity of the metal film-forming composition at the time of its application be adjusted to 1 Pa s (pascal-second) or less and the metal concentration be adjusted to 5 to 50% by mass, and it is preferred to perform the heating of a coating film at 100 to 200° C. in an atmosphere with an oxygen concentration of 500 ppm or less or in a vacuum. It is preferred to adjust the applied amount so that the average of the thickness of the metal film MF on the inner walls of a through hole TH may fall within the range of 10 to 2000 nm. Preferably, the metal film MF is a sintered film of copper particles.

Next, a conductor layer is formed by depositing a conductor such as copper on the entire outer surface of the metal film MF by a plating process. As illustrated in FIG. 6B, the formation of the conductor layer CL is performed until a trench T and each through hole TH of the first wiring layer 131 is filled up with the conductor layer CL.

Next, the conductor layer CL, the metal film MF, and the high melting point film HB are polished, for example, by a chemical mechanical polishing (CMP) process so that the upper surface of the first wiring layer 131 and the upper surface of the conductor layer CL may be located on substantially the same plane. Thereby, as illustrated in FIG. 6C, a contact plug CP comprising a seed layer S and a plug body PB is formed in each through hole TH, and a wire WL is formed in a trench T, and thus, a damascene wire D in a predetermined pattern is formed in the first wiring layer 131. Subsequently, a liner layer L in a predetermined pattern is formed on the first wiring layer 131 as illustrated together in FIG. 6C.

Then, a semiconductor device 100 depicted in FIG. 4A can be obtained by stacking a desired number of wiring layers (those in which a damascene wire D has already been formed) in sequence on the first wiring layer 131 via the liner layer L in the same manner as the formation of the first wiring layer 131 and the formation of the damascene wire D on the first wiring layer 131. As described in the explanation about the semiconductor device 100, if a three-dimensional interconnection is formed as described above, a three-dimensional interconnection having good electrical conductivity can be formed in a relatively high productivity and in a relatively low production cost.

Third Embodiment

Circuit Arrangement Comprising
Three-Dimensional Interconnection

Figure 7A:
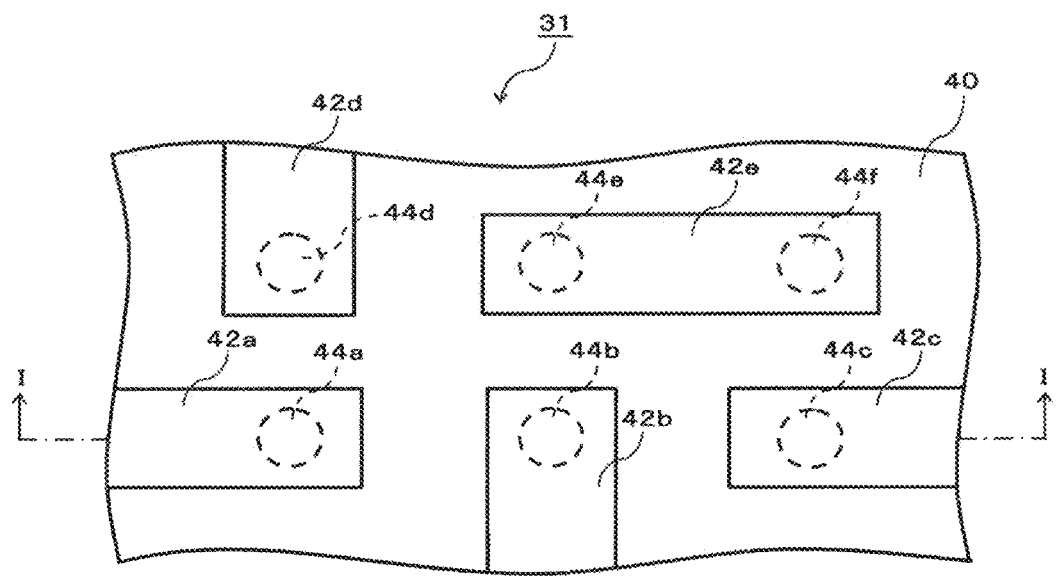
FIG. 7A is a plane view schematically illustrating a circuit arrangement comprising a three-dimensional interconnection according to the third embodiment.
Figure 7B:
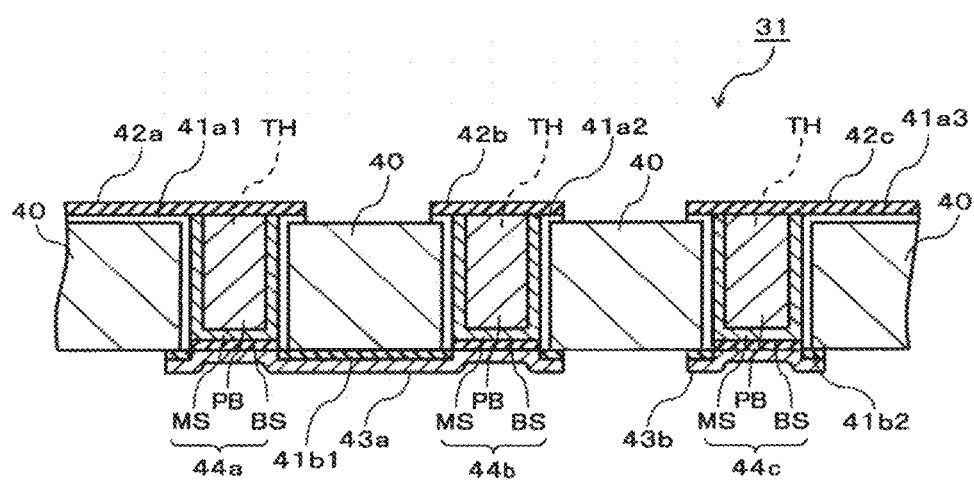
FIG. 7B is a cross-sectional view of FIG. 7A viewed along Line I-I.

FIG. 7A is a plane view schematically illustrating a circuit arrangement comprising a three-dimensional interconnection according to the third embodiment. FIG. 7B is a schematic view along the line I-I illustrated in FIG. 7A. The circuit arrangement having three-dimensional interconnections depicted in FIG. 7A and FIG. 7B is a through-silicon wiring board. Hereinafter, a description is made with the through-silicon wiring board designated as a referential numeral "31".

The through-silicon wiring board 31 has a silicon substrate 40, a plurality of upper wires formed via an upper barrier layer on the upper surface of the silicon substrate 40, a plurality of lower wires formed via a lower barrier layer on the lower surface of the silicon substrate 40, and a plurality of contact plugs each penetrating the silicon substrate 40 and electrically connecting a prescribed upper wire to a prescribed lower wire. Each upper barrier layer is the same in shape and size as the upper wire located thereabove in plan. Likewise, each lower barrier layer is the same in shape and size as the lower wire located therebelow in plan.

Five upper wires 42a to 42e are depicted in FIG. 7A, and three upper wires 42a to 42c and two lower wires 43a to 43b are depicted in FIG. 7B. Six contact plugs 44a to 44f are depicted in FIG. 7A, and three contact plugs 44a to 44c are depicted in FIG. 7B. An upper wire and a lower wire electrically connected to each other by a contact plug constitute one three-dimensional interconnection together with the contact plug.

As illustrated in FIG. 7B, each of the upper barrier layers 41a1 to 41a3 covers the inner wall of a through hole TH in which a corresponding contact plug 44a, 44b, or 44c is provided and the upper surface of silicon substrate 40, and each of the lower barrier layers 41b1 and 41b2 covers the lower surface of the silicon substrate 40. Each of the upper barrier layer 41a1 to 41a3 and the lower barrier layers 41b1 and 41b2 comprises at least one layer formed of, for example, a high melting point metal, an alloy of high melting point metals, and a compound of a high melting point metal and inhibits generation of electromigration from each of the upper wires 42a to 42e, each of the lower wires 43a to 43b, and each of the contact plugs 44a to 44f to the silicon substrate 40.

Specific examples of the material of each of the upper barrier layers 41a1 to 41a3 and the lower barrier layers 41b1 and 41b2 include a three-layer laminate film in which a titanium nitride film and a titanium film are laminated in order on a titanium film, a two-layer laminate film in which a titanium nitride film is laminated on a titanium film, a silicon oxide film, a titanium film, a tantalum film, a tantalum nitride film, and a tungsten nitride film. When the upper barrier layers 41a1 to 41a3 or the lower barrier layers 41b1 and 41b2 are formed from a silicon oxide film, the barrier layers can be formed by naturally oxidizing the surface of the silicon substrate 40. In FIG. 7B, the upper barrier layers 41a1 to 41a3 are depicted without hatching.

Each of the upper wires 42a to 42e and each of the lower wires 43a to 43b are made of, for example, metal such as copper, nickel, gold, silver, and aluminum, or an alloy comprising at least one of these metals, or a transparent conductive material such as ITO (indium•tin oxide), and methods for forming them may be chosen appropriately, e.g., a vapor phase deposition process.

Each contact plug 44a to 44c includes a bottom seed layer BS constituting the lower end surface of the through holes TH, a main seed layer MS which is formed on the side wall of the through holes TH via the upper barrier layer 41a1, 41a2, or 41a3, and covers the bottom seed layer BS and each sidewall of the through hole TH, and a plug body PB that is formed on the main seed layer MS and fills up the through hole TH. The same applies to other contact plugs.

Each bottom seed layer BS is a layer of a conductor, the layer having been formed by depositing copper, nickel, or their alloy, or the like by a vapor phase deposition process, such as a PVD process, including a sputtering process, a CVD process, and an ALD process. The thickness of each bottom seed layer BS is preferably chosen, for example, appropriately within the range of not more than 200 nm, more preferably chosen appropriately within the range of 5 to 100 nm.

Further, each main seed layer MS is a metal film formed by heating a coating film made of a metal film-forming composition containing at least one of a salt of and a particle of a metal selected from Group 10 and Group 11 of the Periodic Table, and it extends from the upper surface of the corresponding bottom seed layer BS to the upper end of the through hole TH. The metal film-forming composition that serves as the material of the main seed layer MS is described in detail below.

The thickness of each main seed layer MS is preferably within the range of 10 to 2000 nm, in an average on the inner wall of a through hole TH, more preferably within the range of 30 to 500 nm. Preferably, each main seed layer MS is a sintered film of copper particles. The through hole TH on which the main seed layer MS is formed preferably has an opening diameter (an opening diameter attained when the formation of the upper barrier layers 41a or their base materials has finished) within the range of 1 to 100 μm, more preferably within the range of 4 to 100 μm, and a ratio of the depth to the opening diameter within the range of 1 to 50.

Each plug body PB is made of a conductor that is deposited on a main seed layer MS by a plating process and fills up a through hole TH. Each plug body PB may be made of, for example, a metal such as copper and nickel, or an alloy comprising at least one of these metals.

Since in the through-silicon wiring board 1 including the above-mentioned constituents, the plug body PB of each of the contact plugs 44a to 44f is formed by a plating process and the upper wires 42a to 42e are electrically connected to the predetermined lower wires by these contact plugs 44a to 44f to constitute the three-dimensional interconnections, the electrical conductivity of the three-dimensional interconnection of the through-silicon wiring board 1 is good.

Since a bottom seed layer BS has already been formed in a through hole TH prior to the formation of the metal film, it is easier to form a metal layer almost uniform in the thickness of a region from the lower end side to the upper end side of the through hole TH. For this reason, when a plug body PB is formed by a plating process, the difference between a time required to form the lower end side of the plug body PB and a time required to form the upper end side can be decreased. As a result, there can reduce the possibility to reach a situation that a plating film deposits excessively on the upper surface side of the silicon substrate 40 during the formation of the plug body PB and the removal thereof requires a long time, or a situation that a takt time increases during the removal of a plating film deposited on the upper surface side of the silicon substrate 40 by a chemical mechanical polishing (CMP) process, or the like. Moreover, generating of voids inside the plug body PB is inhibited. Moreover, it is easy to secure high adhesion of the main seed layer MS to the silicon substrate 40.

Therefore, the through-silicon wiring board 31 is easy to produce at a relatively high productivity at a relatively low production cost.

Hereinafter, an embodiment of a method for forming a three-dimensional interconnection is explained by way of taking a method for producing a through-silicon wiring board 31 as an example with reference to FIGS. 8A to 8D and FIGS. 9A to 9E.

Method for Forming Three-Dimensional Interconnection

FIG. 8A to FIG. 8D are, respectively, cross-sectional views schematically illustrating a step for producing the through-silicon wiring board illustrated in FIG. 7A and FIG. 7B. FIG. 9A to FIG. 9E are, respectively, cross-sectional views schematically illustrating a step performed after the step illustrated in FIG. 8D.

Figure 8A:
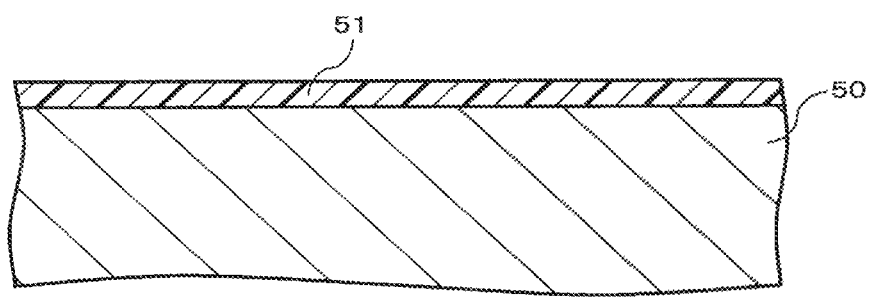
FIG. 8A is a cross-sectional view schematically illustrating a step for producing the circuit arrangement (through-silicon wiring board) comprising the three-dimensional interconnection illustrated in FIG. 7A and FIG. 7B.

As illustrated in FIG. 8A, in producing a through-silicon wiring board 31 depicted in FIG. 7A and FIG. 7B, a mask material layer 51 is first formed on the upper surface of a base material 50 that will eventually be processed into a silicon substrate 40 (see FIG. 7A and FIG. 7B). The material of this mask material layer 51 is suitably chosen depending upon whether blind via holes described below will be formed by a wet etching process or whether the blind via holes will be formed by a wet etching process. When the blind via holes will be formed by a wet etching process, an organic positive type resist layer or an organic negative resist layer may be used as the mask material layer 51. When the blind via holes will be formed by a dry etching process, a silicon nitride film formed by, for example, a plasma CVD process may be used as the mask material layer 51.

Figure 8B:
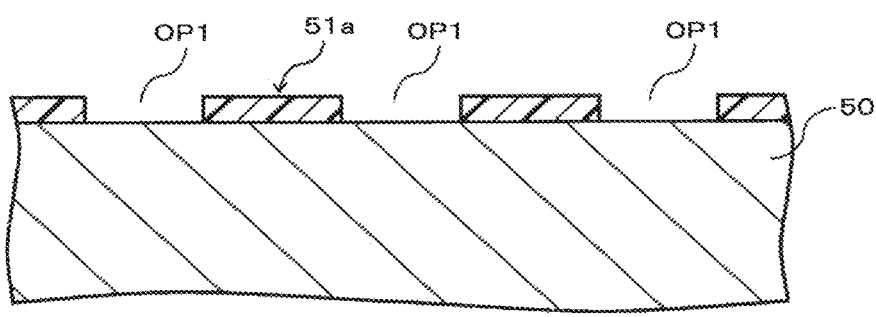
FIG. 8B is a cross-sectional view schematically illustrating a step for producing the circuit arrangement (through-silicon wiring board) comprising the three-dimensional interconnection illustrated in FIG. 7A and FIG. 7B.

Subsequently, the mask material layer 51 is patterned by a lithography process or the like to obtain an etching mask 51a in which openings OP1 have been formed at a plurality of predetermined positions as depicted in FIG. 8B. The positions where the individual openings OP1 are formed correspond to the positions where the through holes TH depicted in FIG. 7B are to be formed.

Figure 8C:
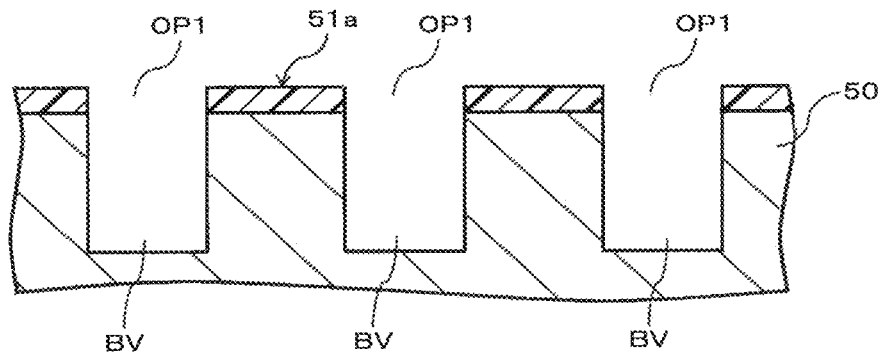
FIG. 8C is a cross-sectional view schematically illustrating a step for producing the circuit arrangement (through-silicon wiring board) comprising the three-dimensional interconnection illustrated in FIG. 7A and FIG. 7B.

Next, the base material 50 is etched from the upper surface side of the base material 50 by, for example, a reactive ion etching process to form blind via holes BV at a plurality of positions of the base material 50 as illustrated in FIG. 8C. Preferably, the individual blind via holes BV are formed to have an opening diameter of 1 to 100 μm, a depth of 20 to 200 μm, and an aspect ratio (a ratio of the depth to the opening diameter) of 1 to 50. The etching mask 51a is removed after the formation of the blind via holes By.

Next, a high melting point film for an upper barrier layer that becomes a base material of an upper barrier layer is formed by a PVD process or a CVD process on the upper surface of the base material 50 and the inner surfaces of each blind via holes BV, and then on a region located on the bottom surface of a blind via hole BV in a high melting point film for an upper barrier layer and on a region located on the upper surface side of the base material 50, a bottom seed layer is formed by a vapor phase deposition process, such as a PVD process, including a sputtering process, a CVD process, or an ALD process. Then, the metal film-forming composition described above is applied by a spin coating process, a printing process, or the like to form a coating film, and then the coating film is heated to form a metal film.

Figure 8D:
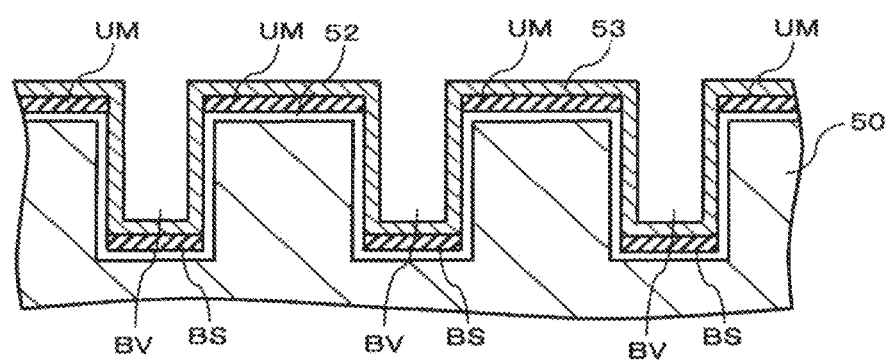
FIG. 8D is a cross-sectional view schematically illustrating a step for producing the circuit arrangement (through-silicon wiring board) comprising the three-dimensional interconnection illustrated in FIG. 7A and FIG. 7B.
Figure 9A:
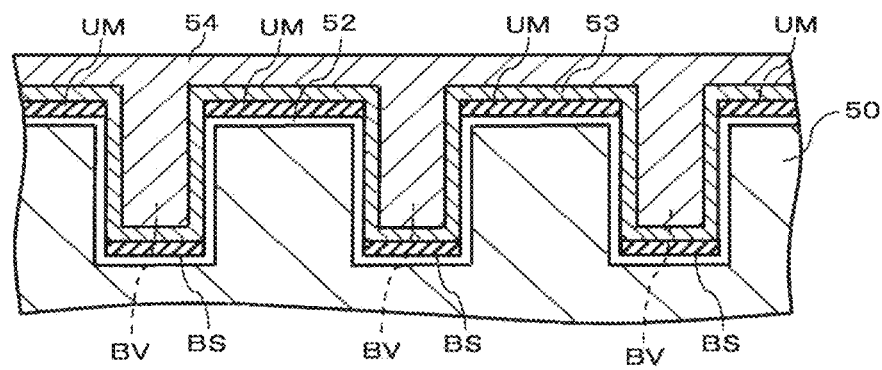
FIG. 9A is a cross-sectional view schematically illustrating a step performed after the step illustrated in FIG. 8D.
Figure 9B:
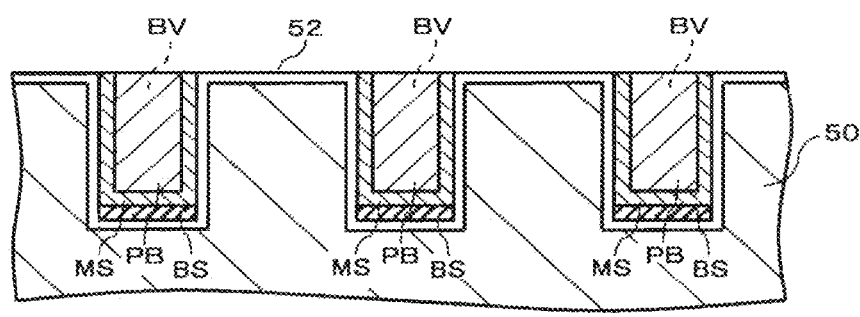
FIG. 9B is a cross-sectional view schematically illustrating a step performed after the step illustrated in FIG. 8D.

By carrying out this treatment, a high melting point film 52 for an upper barrier layer, bottom seed layer BS and a metal film 53 are stacked in order on the bottom surface of each blind via hole BV, a barrier layer 52 and a metal film 53 are stacked in order on the inner wall of each blind via hole BV, and a high melting point film 52 for an upper barrier layer, an upper conductive film UM, and a metal film 53 are stacked in order on the upper surface of the base material 50 as illustrated in FIG. 8D. The upper conductive film UM is a film that was formed simultaneously with the bottom seed layer BS at the time of forming the bottom seed layer BS. By forming the upper conductive film UM, the electrical resistance value of the upper surface of the base material 50 can be held lower as compared with the case where only a main seed layer, described below, is formed and the productivity in the subsequent plating step can be rendered higher. At the time of forming the bottom seed layer BS, a discontinuous film or a very thin conductor film may have been formed from the material for forming the bottom seed layer BS on a region that covers the inner wall of a blind via hole BV within the barrier layer B. In FIG. 8D as well as FIG. 9A and FIG. 9B, provided below, the high melting point film 52 for an upper barrier layer is depicted without hatching.

The high melting point film 52 for an upper barrier layer corresponds to a base material of the individual upper barrier layers 41a1 to 41a3 depicted in FIG. 7B and, for example, a high melting point film comprising at least one layer made of a high melting point metal an alloy of high melting point metals, or a compound of a high melting point metal, specifically, a high melting point film, such as a three-layer laminate film in which a titanium nitride film and a titanium film are stacked in order on a titanium film, a two-layer laminate film in which a titanium nitride film is stacked on a titanium film, a silicon oxide film, a titanium film, a tantalum film, a tantalum nitride film, and a tungsten nitride film, can be formed by a PVD process, a CVD process, or the like.

The metal film 53 corresponds to a base material of the main seed layer MS depicted in FIG. 7B. The metal film 53 has good step coverage. In forming the metal film 23, it is preferred that the viscosity of the metal film-forming composition at the time of its application be adjusted to 1 Pa·s (pascal-second) or less and the metal concentration be adjusted to 5 to 50% by mass, and it is preferred to perform the heating of a coating film at 100 to 200° C. in an atmosphere with an oxygen concentration of 500 ppm or less or in a vacuum. It is preferred to adjust the applied amount so that the average of the thickness of the metal film 53 on the inner walls of blind via holes BV may fall within the range of 10 to 2000 nm. Preferably, the metal film 53 is a sintered film of copper particles.

Next, a conductor layer 54 is formed by depositing a conductor such as copper on the entire outer surface of the metal film 53 by a plating process. As illustrated in FIG. 9A, the formation of the conductor layer 54 is performed until each blind via hole BV is filled up with the conductor layer 54. The conductor layer 54 becomes a base material of the upper wires 42a to 42c and each plug body PB respectively illustrated in FIG. 7B.

Subsequently, the step of polishing away, by a chemical mechanical polishing (CMP) process or the like, regions formed on the upper surface side of the base material 50 is performed for each of the metal film 53 and the conductor layer 54. This polishing is performed until the upper surface of the high melting point film 52 for an upper barrier layer on the upper surface of the base material 50 and the upper surface of the conductor layer 54 will be located on substantially the same plane. By carrying out the step, the regions of the metal film 53 located on the upper surface side of the base material 50 are removed as illustrated in FIG. 9B and thereby the metal film 53 becomes a main seed layer MS, and the plug bodies PB of the individual contact plugs 44a to 44f depicted in FIG. 7A are formed from the conductor layer 54.

Figure 9C:
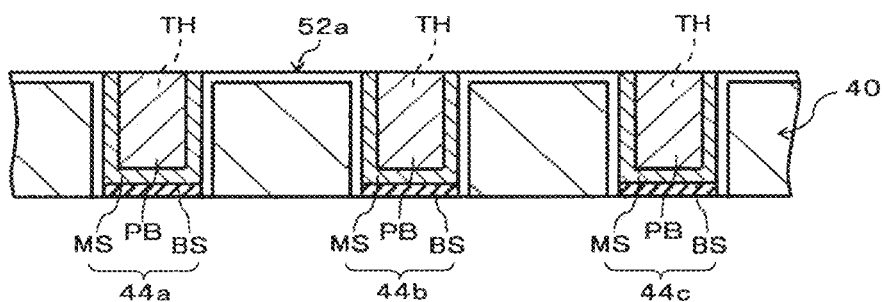
FIG. 9C is a cross-sectional view schematically illustrating a step performed after the step illustrated in FIG. 8D.
Figure 9D:
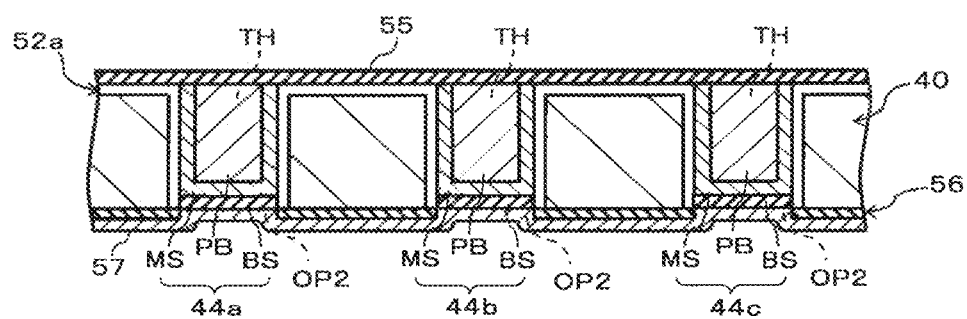
FIG. 9D is a cross-sectional view schematically illustrating a step performed after the step illustrated in FIG. 8D.

Subsequently, the base material 50 is polished from the lower surface side of the base material 50 and thereby the thickness thereof is reduced. This polishing is performed until the lower surface of the bottom seed layer BS is completely exposed as depicted in FIG. 9C. The polishing treatment may be performed until the bottom seed layer BS is removed completely. By this polishing, the base material 50 becomes a silicon substrate 40 depicted in FIG. 7B. By the polishing treatment, regions of the high melting point film 52 for an upper barrier layer, the regions having been located on the bottom surfaces of blind via holes BV, and certain regions above the regions are also removed and thereby the high melting point film 52 for an upper barrier layer becomes a polished high melting point film 52a for an upper barrier layer. The blind via holes BV become through holes TH depicted in FIG. 7B. As a result, the individual contact plugs 44a to 44f depicted in FIG. 7A are formed. In FIG. 9C and FIG. 9D, provided below, the polished high melting point film 52a for an upper barrier layer is depicted without hatching.

Next, as illustrated in FIG. 9D, a conductor film 55 for an upper wire is formed on the upper surface of the silicon substrate 40 and a high melting point film for a lower barrier layer that becomes a base material of the lower barrier layers 41b1 and 41b2 illustrated in FIG. 7B is formed on the lower surface of the silicon substrate 40, and then the high melting point film for a lower barrier layer is patterned into a desired shape and thereby a high melting point film 56 for a lower barrier layer is formed. Thereafter, a conductor film 57 for a lower wire is formed on the entire lower surface side of the silicon substrate 40.

Conductive film 55 for the upper wire may be made of, for example, metal such as copper, nickel, gold, silver, and aluminum, or an alloy comprising at least one of these metals, or a transparent conductive material such as ITO (indium•tin oxide), and methods for forming them may be chosen appropriately, e.g., a vapor phase deposition process.

The high melting point film 56 for a lower barrier layer has openings OP2 in which lower end surfaces of the individual contact plugs 44a to 44f are exposed. In the same fashion as the high melting point film 52 for an upper barrier layer, the high melting point film 56 for lower barrier layers can be formed by forming a high melting point film comprising at least one layer made of a high melting point metal, an alloy of high melting point metals, or a compound of a high melting point metal on the entire lower surface of the silicon substrate 40 by a PVD process, a CVD process, or the like, and then patterning the high melting point film by a lithography process, thereby forming the above-mentioned openings OP2 at predetermined positions. It is also possible to form a high melting point film 56 for a lower barrier layer by naturally oxidizing the lower surface of the silicon substrate 40.

The conductive film 57 for the upper wire, in the same fashion as the conductive film 55 for the upper wire, may be made of, for example, metal such as copper, nickel, gold, silver, and aluminum, or an alloy comprising at least one of these metals, or a transparent conductive material such as ITO (indium•tin oxide), and methods for forming them may be chosen appropriately, e.g., a vapor phase deposition process. The conductor film 27 for a lower wire covers the high melting point film 57 for a lower barrier layer and the lower end surfaces of the individual contact plugs 44a to 44f.

In the case where a naturally oxidized film has been formed on the upper end surfaces of the individual contact plugs 44a to 44f during a period from the completion of the formation of the individual contact plugs 44a to 44f to the completion of the formation of the conductor film 55 for an upper wire, it is preferred to form the conductor film 55 for an upper wire after removing the naturally oxidized film by wet etching, or the like. The same applies to the case where a naturally oxidized film has been formed on the lower end surfaces of the individual contact plugs 44a to 44f during a period from the completion of the formation of the individual contact plugs 44a to 44f to the completion of the formation of the conductor film 57 for a lower wire.

Subsequently, a resist layer is formed from an organic resist material on the upper surface of the conductor film 55 for an upper wire, and then the resist layer is patterned by, for example, a wet etching process to obtain an etching mask in which an opening is formed at each of a plurality of predetermined positions. The positions where the individual openings are formed correspond to positions excluding the positions where the upper wires 42a to 42e depicted in FIG. 7A.

Figure 9E:
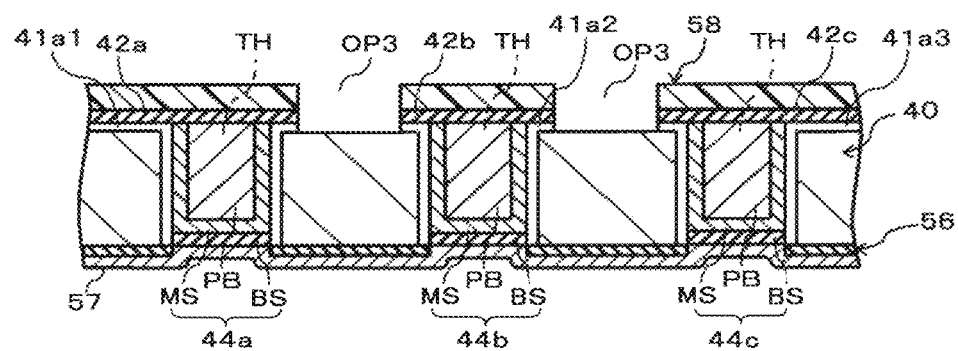
FIG. 9E is a cross-sectional view schematically illustrating a step performed after the step illustrated in FIG. 8D.

Next, the conductor film 55 for an upper wire and the polished high melting point film 52a for an upper barrier layer located thereunder are etched by, for example, a wet etching process from the upper surface side of the conductor film 55 for an upper wire. At this time, as illustrated in FIG. 9E, a region that has located under an opening OP3 of an etching mask 58 of the conductor films 55 for an upper wire and a region that has located under an opening OP3 of the polished high melting point film 52a for an upper barrier layer are etched away. By this etching, the individual upper wires 42a to 42e depicted in FIG. 7A are formed and upper barrier layers that intervene between the individual upper wires 42a to 42e and the silicon substrate 40 are formed. In FIG. 9E, there are depicted three upper wires 42a to 42c and three upper barrier layers 41a1 to 41a3 that are depicted in FIG. 7B.

Then, the conductor film 57 for a lower wire and the high melting point film 56 for a lower barrier layer are etched in the same way as the etching of the conductor film 55 for an upper wire to form a prescribed number of lower wires and lower barrier layers. By forming the lower wires and the lower barrier layers, the through-silicon wiring board 31 with three-dimensional interconnections illustrated in FIG. 7A and FIG. 7B is obtained.

If three-dimensional interconnections are formed as described above, a three-dimensional interconnection having good electrical conductivity can be formed in a relatively high productivity and in a relatively low production cost as described in the explanation about the through-silicon wiring board 1.

Fourth Embodiment

Circuit Arrangement Comprising Three-Dimensional Interconnection

Figure 10A:
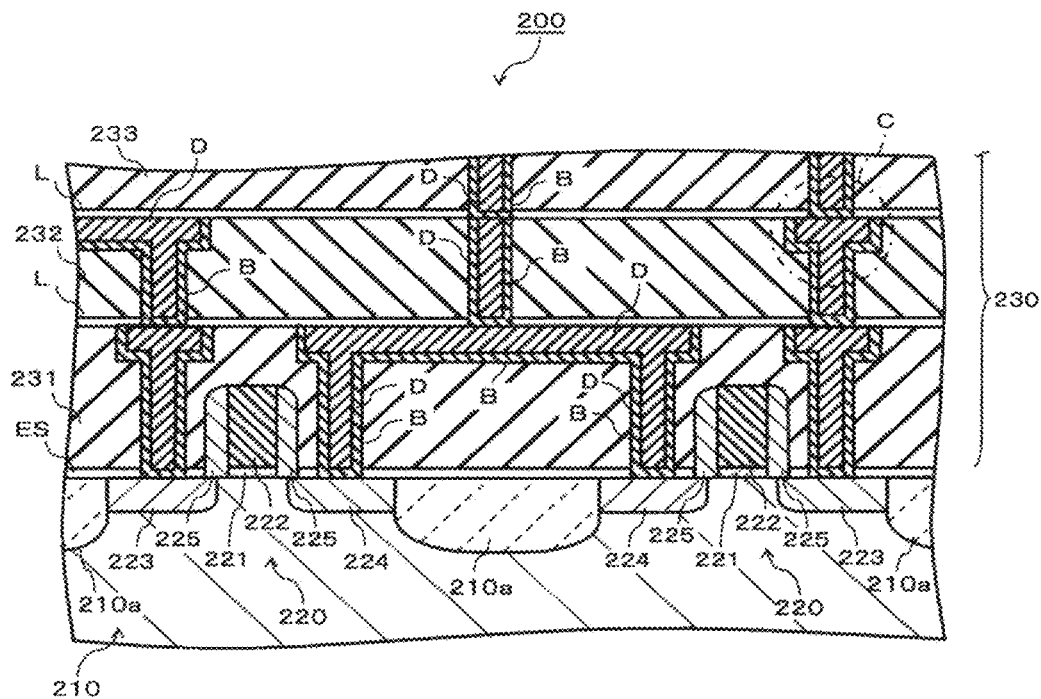
FIG. 10A is a cross-sectional view schematically illustrating a circuit arrangement comprising three-dimensional interconnection according to the fourth embodiment.
Figure 10B:
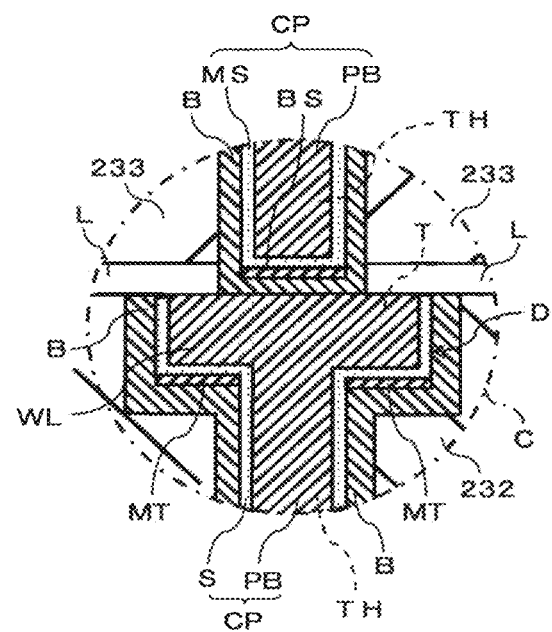
FIG. 10B is a cross-sectional view of FIG. 10A viewed along Line I-I.

FIG. 10A is a cross sectional view schematically illustrating a circuit arrangement having three-dimensional interconnection according to the fourth embodiment. FIG. 10B is an expanded view of the dot-dash line indicated by C in FIG. 10A. The circuit arrangement including the three-dimensional interconnection illustrated in FIG. 10A is a semiconductor device. Hereinafter, a description is made with the semiconductor device designated as a referential numeral "200".

The semiconductor device 200 depicted in FIG. 10A comprises a semiconductor substrate 210, a plurality of circuit elements formed on the semiconductor substrate 210, and a multilevel interconnection 230 formed on the semiconductor substrate 210 to covered these circuit elements. In FIG. 10A, two field effect transistors 220, 220 are depicted as the above-mentioned circuit elements. Hereinafter, the individual components of the semiconductor device 200 are explained.

The semiconductor substrate 210 is a silicon single crystal substrate in which isolation regions 210a for electrically isolating circuit elements arranged adjacent to each other are formed in a predetermined pattern. A substrate made of a compound semiconductor such as gallium arsenide or an SOI (Silicon On Insulator) substrate can also be used instead of the silicon single crystal substrate. A plurality of circuit elements formed on a semiconductor substrate 210 constitute an integrated circuit together with a multilevel interconnection 230 formed on the semiconductor substrate 210, and the type and the number of circuit elements to be formed on the semiconductor substrate 210 are chosen appropriately according to the function required of the semiconductor device 200, the application of the semiconductor device 200, etc.

Each field effect transistor 220 comprises a gate electrode 222 disposed via a gate dielectric film 221 on a semiconductor substrate 210, a source region 223 and a drain region 224 which are formed on the semiconductor substrate 210, and sidewall spacers 225 formed on both sides in a line width direction of the gate electrode 222. In FIG. 10A, the gate dielectric film 221 is smudged.

The multilevel interconnection 230 has a plurality of wiring layers stacked via an etching stopper film ES on the semiconductor substrate 210, and a liner layer L intervening between two vertically adjacent wiring layers. In FIG. 10A, three layers in total, the first wiring layer 231 to the third wiring layer 233 are depicted. In FIG. 10A, the etching stopper film ES and each liner layer L are depicted without hatching.

The etching stopper film ES is formed from, for example, silicon carbon nitride or silicon nitride and is used as an etching stopper at the time of providing a through hole (contact hole) in an electrically insulative layer that serves as a base material of the first wiring layer 231. Preferably, each liner layer L is formed from a material differing from the base material of the wiring layer that serves as the base of the liner layer L. For example, in the case of having used silicon oxide as a base material of a wiring layer, it is preferred to form a liner layer made of, for example, silicon carbon nitride or the like on the wiring layer formed from the base material.

Each of the wiring layers 231 to 233 has a barrier layer B that covers the inner surfaces of trenches and through holes in a predetermined pattern formed by a wet etching process or a dry etching process in an electrically insulative layer that serves as a base material and also covers an underlayer exposed to the lower openings of the through holes, and a damascene wire D that is formed on the barrier layer B and fills up each of the trenches and through holes. The electrically insulative layer may be formed, for example of silicon oxide, silicon nitride, a low-κ dielectric, or the like. In the same fashion as the upper barrier layer 41a depicted in FIG. 7B, the barrier layer B comprises at least one layer made of, for example, a high melting point metal, an alloy of high melting point metals, or a compound of a high melting point metal. In the same fashion as each upper barrier layer 41a1 to 41a3 depicted in FIG. 7B, the barrier layer B comprises at least one layer made of, for example, a high melting point metal, an alloy of high melting point metals, or a compound of a high melting point metal.

As illustrated in FIG. 10B, each damascene wire D comprises a bottom seed layer BS formed on a region covering an underlayer exposed from the lower opening of a through hole TH in a barrier layer B, a metal film-in-trench MT that covers the bottom surface of a trench T, a main seed layer MS that covers a region covering the inner surfaces of the trench T and the through hole TH in the barrier layer B, the upper surface of the bottom seed layer BS, and the upper surface of the metal film-in-trench MT, and a conductor that is formed on the main seed layer MS and fills up the trench T and the through hole TH. In the conductor, a region filling up the trench T serves a wire WL and a region filling up the through hole TH serves as a contact plug body PB of a contact plug CP. The plug body PB, the bottom seed layer BS, and the region formed within the through hole TH in the main seed layer MS make up a contact plug CP.

For each contact plug CP, the wire WL electrically contacted to the upper end of the contact plug CP corresponds to an upper wire, and the wire WL or other contact plug CP electrically connected via a barrier layer B on the lower end side of the contact plug CP corresponds to a lower wire.

The bottom seed layer BS constituting the damascene wire D in the same fashion as the bottom seed layer BS illustrated in FIG. 7B, is a layer of a conductor, the layer having been formed by depositing copper, nickel, or their alloy, or the like by a vapor phase deposition process, such as a PVD process, including a sputtering process, a CVD process, and an ALD process. The thickness of each bottom seed layer BS is preferably chosen, for example, appropriately within the range of not more than 200 nm, more preferably chosen appropriately within the range of 5 to 100 nm. The metal film-in-trench MT is a film that was formed simultaneously with the bottom seed layer BS at the time of forming the bottom seed layer BS. At the time of forming the bottom seed layer BS, a discontinuous film or a very thin conductor film may have been formed from the material for forming the bottom seed layer BS on a region that covers the inner wall of a blind via hole BV within the barrier layer B. Likewise, at the time of forming the bottom seed layer BS, a conductor layer may be formed from the same material as the bottom seed layer BS on the upper surface side of the wiring layer.

Further, in the same fashion as the main seed layer MS illustrated in FIG. 7B, the main seed layer MS constituting the damascene wire D is a metal film formed by heating a coating film of a metal film-forming composition containing at least one of a salt of and a particle of a metal selected from Group 10 and Group 11 of the Periodic Table. The thickness of each main seed layer MS is preferably within the range of 10 to 2000 nm, in an average on the inner wall of a through hole TH. Preferably, each main seed layer MS is a sintered film of copper particles. The through hole TH on which the main seed layer MS is formed preferably has an opening diameter (an opening diameter attained when the formation of the barrier layer B has finished) within the range of 1 to 100 μm, and a ratio of the depth to the opening diameter within the range of 1 to 50. Further, the conductor that constitutes the damascene wire D and the wire WL is deposited on the main seed layer MS by a plating process. As this conductor, copper can be used, for example.

The contact plug formed in the first wiring layer 231 is electrically connected to a source region 223 or a drain region 224 of a field effect transistor 220 via a certain region of a barrier layer B formed in the first the wiring layer 231. Likewise, contact plugs formed in each of the second wiring layer 232 and the third wiring layer 233 are electrically connected to a damascene wire D formed in the first wiring layer 231 or the second wiring layer 232 located directly thereunder via certain regions of the barrier layer B formed in the wiring layers 232, 233. For each contact plug CP, the wire WL or other contact plus CP electrically contacted to the upper end of the contact plug CP via the barrier layer B corresponds to an upper wire, and the wire WL or other contact plug CP electrically connected via a barrier layer B on the lower end side of the contact plug CP corresponds to a lower wire. Many three-dimensional interconnections are formed in the multilevel interconnection 230.

Since in the semiconductor device 200 including the above-mentioned constituents, the three-dimensional interconnection is formed by the damascene wire D, the electrical conductivity of the three-dimensional interconnection of semiconductor device 200 is good. For example, also in the case of having used, as the barrier layer B, a material capable of being oxidized easily by atmospheric oxygen, deterioration in conductivity at the interface between the barrier layer B and the main seed layer MS can be suppressed because the two layers are connected via the bottom seed layer BS. The above-mentioned coating film of the metal film-forming composition which can be used as a material of the main seed layer MS, has good step coverage and a metal film almost uniform in film thickness from the lower end side to the upper end side of a through hole TH can easily be formed therefrom. Furthermore, as the bottom seed layer BS has already been formed in the through holes TH before the formation of the metal film, a metal film almost uniform in film thickness from the lower end side to the upper end side of a through hole TH can further easily be formed therefrom. For this reason, when a plug body PB is formed by a plating process, the difference between a time required to form the lower end side and a time required to form the upper end side of the plug body PB is easily reduced. As a result, there can reduce the possibility to reach a situation that a plating film deposits excessively on the upper surface side of the wire layer during the formation of the plug body PB and the removal thereof requires a long time, or a situation that a takt time increases during the removal of a plating film deposited on the upper surface side of wire layer by a chemical mechanical polishing (CMP) process, or the like. Further, generating of voids inside the plug body PB is inhibited. Moreover, it is easy to secure high adhesion of the main seed layer MS to the wiring layer.

Therefore, in the semiconductor device 200, a multilevel interconnection 230 is easy to produce at a relatively high productivity at a relatively low production cost. As a result, the semiconductor device 200 is easy to produce at a relatively high productivity at a relatively low production cost.

Hereinafter, an embodiment of a method for forming a three-dimensional interconnection is explained by way of taking a method for producing a semiconductor device 200 as an example with reference to FIGS. 11A to 11C and FIGS. 12A to 12C.

Figure 11A:
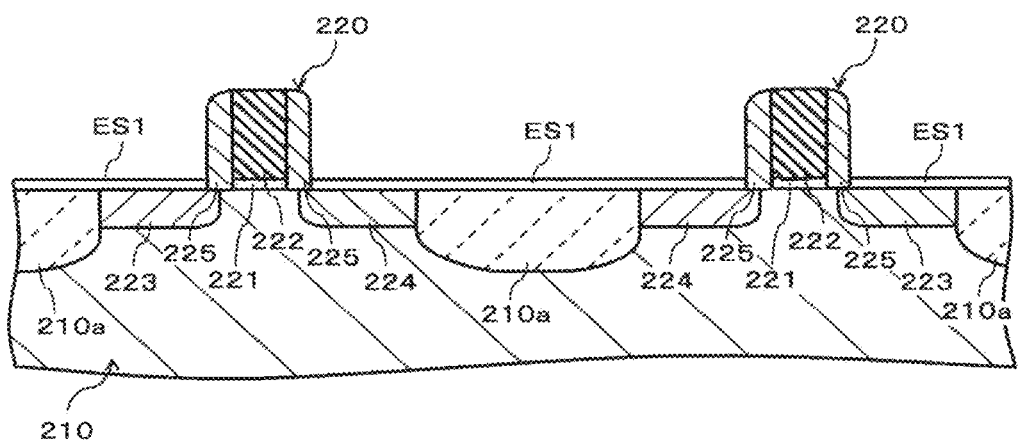
FIG. 11A is a cross-sectional view schematically illustrating a step for producing the circuit arrangement (through-silicon wiring board) comprising the three-dimensional interconnection illustrated in FIG. 10A and FIG. 10B.
Figure 11B:
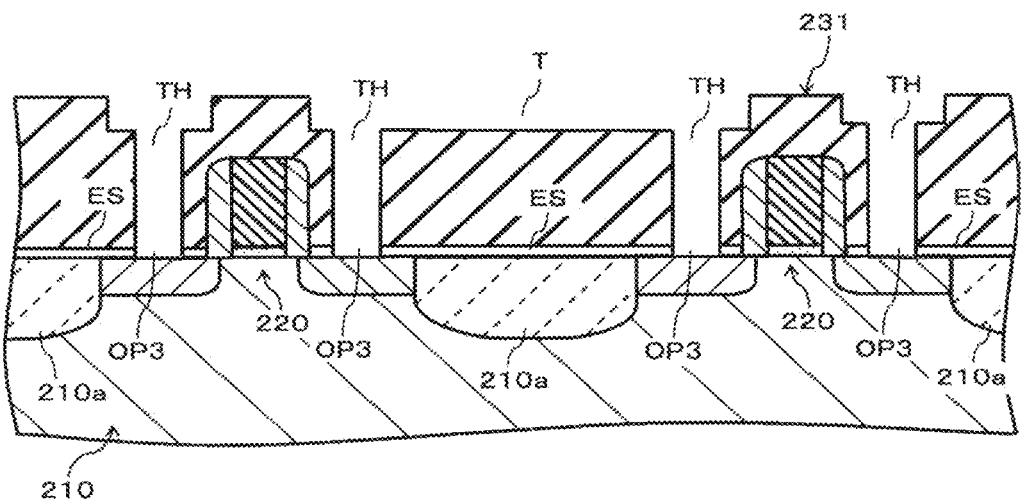
FIG. 11B is a cross-sectional view schematically illustrating a step for producing the circuit arrangement (through-silicon wiring board) comprising the three-dimensional interconnection illustrated in FIG. 10A and FIG. 10B.
Figure 11C:
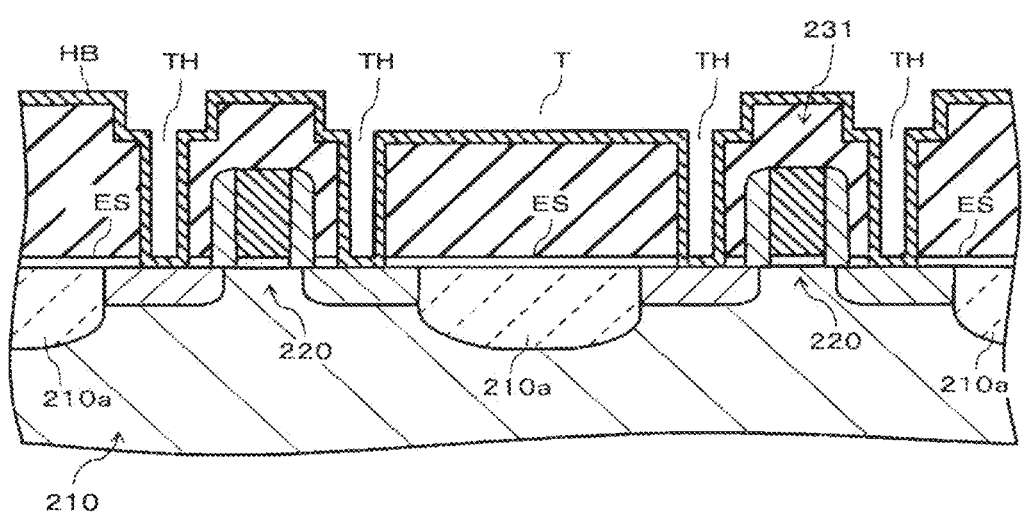
FIG. 11C is a cross-sectional view schematically illustrating a step for producing the circuit arrangement (through-silicon wiring board) comprising the three-dimensional interconnection illustrated in FIG. 10A and FIG. 10B.

FIG. 11A to FIG. 11C are, respectively, cross-sectional views schematically illustrating a step for producing the semiconductor device illustrated in FIG. 10A and FIG. 10B.

Figure 12A:
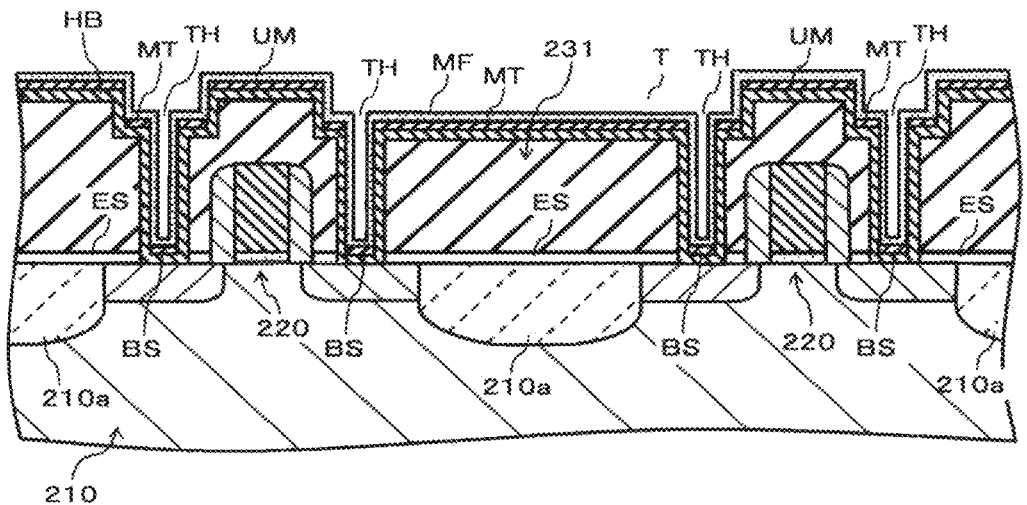
FIG. 12A is cross-sectional view schematically illustrating a step performed after the step illustrated in FIG. 11C.
Figure 12B:
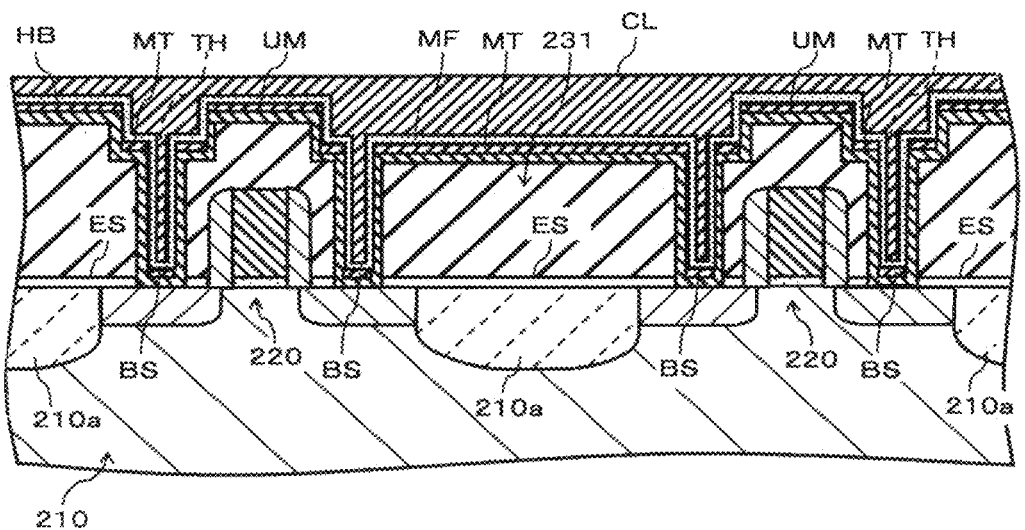
FIG. 12B is cross-sectional view schematically illustrating a step performed after the step illustrated in FIG. 11C.
Figure 12C:
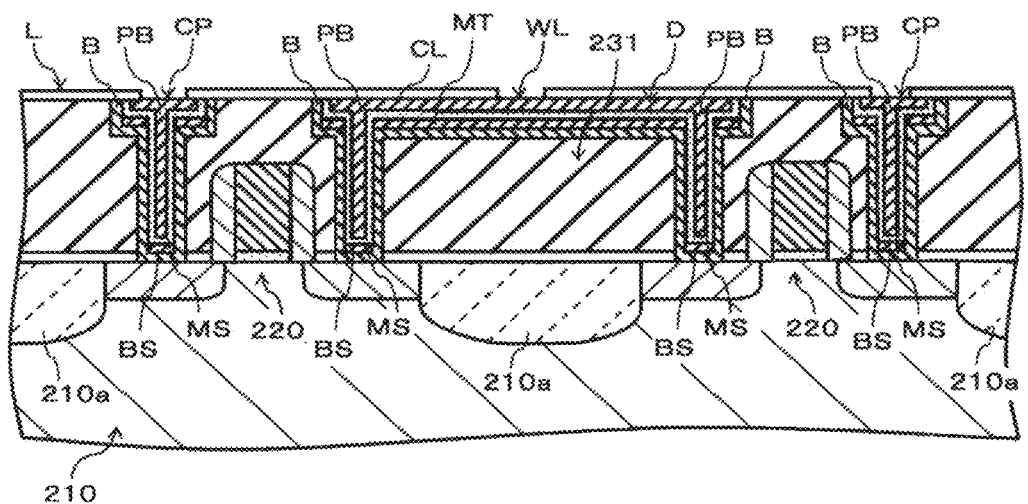
FIG. 12C is cross-sectional view schematically illustrating a step performed after the step illustrated in FIG. 11C.

FIG. 12A to FIG. 12C are, respectively, cross-sectional views schematically illustrating a step performed after the step illustrated in FIG. 11C.

As illustrated in FIG. 11A, in manufacturing a semiconductor device 200 depicted in FIG. 10A and FIG. 10B, a first etching stopper film ES1, which is a base material of the etching stopper film ES depicted in FIG. 10A, is formed first by a PVD process or a CVD process on a semiconductor substrate 210 on which a desired circuit element such as a field effect transistor 220 has been formed. The first etching stopper film ES1 may be formed so as to cover a gate electrode 222 of each field effect transistor 220 and the individual sidewall spacer 225. In FIG. 11A, the first etching stopper film ES1 are depicted without hatching.

Next, an electrically insulative layer that serves as a base material of the first wiring layer 231 is formed on a semiconductor substrate 210 by a PVD process or a CVD process and an etching mask in a predetermined shape is formed thereon, and then the electrically insulative layer is formed by a wet etching process or a dry etching process. Thus, a first wiring layer having trenches and through holes in a predetermined pattern is obtained. Then, the first etching stopper film ES1 is etched using the above-described etching mask as it is, thereby removing a region located under a through hole provided in the first wiring layer 231. Thus, the first etching stopper film ES1 is processed into the etching stopper film ES depicted in FIG. 10A.

FIG. 11B illustrates the first wiring layer 231 and the etching stopper film ES formed as described above. In the first wiring layer 231, a prescribed number of trenches T and through holes TH have been formed. In the etching stopper film ES, openings OP3 have been formed at the regions located under through holes TH provided in the first wiring layer 231. In FIG. 11B as well as FIG. 11C and FIG. 12A to FIG. 12C, provided below, the etching stopper film ES11 is depicted without hatching.

Subsequently, a predetermined mask in which the trench T and each through hole TH of the first wiring layer 231 are exposed, is provided on the first wiring layer 231. For example, a high melting point film is formed, by a CVD process, and thereby a high melting point film HB for a barrier layer is formed as illustrated in FIG. 11C, the high melting point film covering the inner surface of the trench T, the inner surface of the through hole TH, the inner wall of the opening OP3 in the etching stopper film ES, and the surface of the semiconductor substrate 210 exposed from the opening OP3. The material high melting point film HB for a barrier layer may be, for example, the same material as that of the individual upper barrier layers 41a1 to 41a3 depicted in FIG. 7B.

Next, the bottom seed layer is formed by a sputtering process on the region located on the lower end side of the through holes TH, and the above-mentioned metal film-forming composition is then applied onto the upper surface of the first wiring layer 231, the inner surface of the trench T, and the inner surface of each through holes TH by a spin coating process, a printing process, or the like to form a coating film, and then the coating film is heated to form a metal film MF on the high melting point film HB for a barrier layer as illustrated in FIG. 12A.

At the time of forming the bottom seed layer BS, a conductor deposits also on the high melting point film HB for a barrier layer and a conductive layer is formed also above the bottom surface of the trench T and above the upper surface of the wiring layer 231. Of the conductive film, one that deposited above the bottom surface of the trench T becomes a metal film-in-trench MT. In a region where the inner wall of the through hole TH is covered in the high melting point film HB for a barrier layer, a discontinuous film or a very thin conductor film may be formed from the material for forming the bottom seed layer BS.

In forming the metal film MF, it is preferred that the viscosity of the metal film-forming composition at the time of its application be adjusted to 1 Pa·s (pascal-second) or less and the metal concentration be adjusted to 5 to 50% by mass, and it is preferred to perform the heating of a coating film at 100 to 200° C. in an atmosphere with an oxygen concentration of 500 ppm or less or in a vacuum. It is preferred to adjust the applied amount so that the average of the thickness of the metal film MF on the inner walls of the through holes TH may fall within the range of 10 to 2000 nm. Preferably, the metal film MF is a sintered film of copper particles. The metal film MF covers the upper surface of the first wiring layer 231, the inner surface of the trench T, the inner wall of each through hole TH, and the bottom seed layer BS with good step coverage.

Next, a conductor layer is formed by depositing a conductor such as copper on the entire outer surface of the metal film MF by a plating process. As illustrated in FIG. 12B, the formation of the conductor layer CL is performed until the trench T of the first wiring layer 231 and each through hole TH is filled up with the conductor layer CL.

Next, the metal film MF is polished, for example, by a chemical mechanical polishing (CMP) process so that the upper surface of the first wiring layer 231 and the upper surface of the conductor layer CL may be located on substantially the same plane. Thereby, as illustrated in FIG. 12C, a contact plug CP comprising a bottom seed layer BS, main seed layer MS, and a plug body PB is formed in each through hole TH, and a wire WL including the metal film-in-trench MT and a conductor layer CL is formed in a trench T, and thus, a damascene wire D in a predetermined pattern is formed in the first wiring layer 231. Subsequently, a liner layer L in a predetermined pattern is formed on the first wiring layer 231 as illustrated together in FIG. 12C.

Then, a semiconductor device 200 depicted in FIG. 10A can be obtained by stacking a desired number of wiring layers (those in which a damascene wire D has already been formed) in sequence on the first wiring layer 231 via the liner layer L in the same manner as the formation of the first wiring layer 231 and the formation of the damascene wire D on the first wiring layer 231. As described in the explanation about the semiconductor device 200, if a three-dimensional interconnection is formed as described above, a three-dimensional interconnection having good electrical conductivity can be formed in a relatively high productivity and in a relatively low production cost.

Fifth Embodiment

Formation of Metal Film-Forming Composition and Metal Film

As described herein, a "metal film-forming composition" refers to a composition to be used to form a metal film. The metal film-forming composition that is embodiment 5 of the present invention comprises at least one of a metal salt and a metal particle. This component is hereinafter referred to as component (A). The metal film-forming composition of this embodiment can contain an amine compound as the component (B). Moreover, it can contain a solvent or a dispersing medium as an optional component. This solvent or dispersing medium is hereinafter referred to as component (C). Moreover, the metal film-forming composition of this embodiment can contain other optional components in addition to the above-mentioned components.

The metal film-forming composition of this embodiment can be formed into a coating film by various coating processes known in the art, and the coating film can form a metal film on being heated. At this time, since the metal film-forming composition of this embodiment has the above-described composition, it is possible to form a metal film on a substrate by forming a coating film by applying the composition onto an appropriate substrate, then heating the coating film under the atmosphere, or under a non-oxidative atmosphere of nitrogen gas, etc., or under an atmosphere with an oxygen concentration of 500 ppm or less, or in a vacuum. The heating temperature may be 250° C. or lower and also may be a further lower temperature being 200° C. or lower.

The metal film-forming composition of this embodiment can be used for forming a seed layer S of embodiment 1, a metal film for forming a three-dimensional interconnection of embodiment 2, a main seed layer of embodiment 3, and a metal film for forming a three-dimensional interconnection of embodiment 4, and it can be used as a metal film-forming composition for a three-dimensional connection. Each component of the metal film-forming composition according to the present embodiment will be described as follows.

Component (A)

As described above, the metal film-forming composition of this embodiment comprises at least one of a metal salt and a metal particle, which serves as a raw material to a metal film, as the component (A).

Preferably, the component (A) is at least one of a salt and a particle of a metal selected from Group 10 and Group 11 of the Periodic Table. Inclusion of at least one of a salt and a particle of a metal selected from Group 10 and Group 11 of the Periodic Table as the component (A) makes it possible to form a metal film having low electrical resistance.

From the perspective of forming a metal film having low electrical resistance easily, the metal film-forming composition of this embodiment preferably contains at least one of a metal salt or a metal particle containing a metal selected from the group consisting of transition metals of Group 10 and Group 11 of the Periodic Table (palladium (Pd), platinum (Pt), copper (Cu), silver (Ag), nickel (Ni), and gold (Au)) as the component (A). From the perspective of forming a metal film having low electrical resistance in a lower production cost, it is particularly preferred that the metal film-forming composition of this embodiment contain at least one of a metal salt and a metal particle containing a metal selected from the group consisting of copper, silver, and nickel as the component (A).

The metal salt that can be used as the component (A) may be any compound containing a metal ion and is not particularly limited. As this metal salt, for example, a metal salt composed of a metal ion and at least one of an inorganic anion and an organic anion can be used.

As described above, in the metal film-forming composition of this embodiment, it is particularly preferred to use a metal salt containing a metal selected from the group consisting of from copper, silver, and nickel as the component (A). In the case of using a metal salt containing copper, namely, a copper salt as the component (A), it is preferred from the viewpoint of solubility to use one or two or more species selected from the group consisting of copper carboxylate and a complex salt of copper with an acetylacetone derivative.

Examples of preferred copper carboxylate include copper salts with aliphatic carboxylic acids, such as copper acetate, copper trifluoroacetate, copper propionate, copper butyrate, copper isobutyrate, copper 2-methylbutyrate, copper 2-ethylbutyrate, copper valerate, copper isovalerate, copper pivalate, copper hexanoate, copper heptanoate, copper octanoate, copper 2-ethylhexanoate, and copper nonanoate, copper salts with dicarboxylic acids, such as copper malonate, copper succinate, and copper maleate, copper salts with aromatic carboxylic acids, such as copper benzoate and copper salicylate, copper salts with carboxylic acids having reducing power, such as copper formate, copper hydroxyacetate, copper glyoxylate, copper lactate, copper oxalate, copper tartarate, copper malate, and copper citrate, and hydrates of the copper salts listed above.

Examples of the complex salt of copper with an acetylacetone derivative include complex salts in which one molecule or two molecules of an acetylacetone derivative or an acetoacetic ester derivative have complexed per copper atom, and specific preferred examples thereof include acetylacetonato copper, ethyl acetoacetate copper, 1,1,1-trimethylacetylacetonato copper, 1,1,1,5,5,5-hexamethylacetylacetonato copper, 1,1,1-trifluoroacetylacetonato copper, and 1,1,1,5,5,5-hexafluoroacetylacetonato copper.

Among these, from the viewpoint of solubility and from the perspective of forming a metal film (copper film) having low electrical resistance, examples of a preferred copper salt include copper acetate, copper trifluoroacetate, copper propionate, copper butyrate, copper isobutyrate, copper 2-methylbutyrate, copper pivalate, copper formate, copper hydroxyacetate, copper glyoxylate, copper oxalate, acetylacetonato copper, ethyl acetoacetate copper, 1,1,1-trifluoroacetylacetonato copper, 1,1,1,5,5,5-hexafluoroacetylacetonato copper, and hydrates thereof. Moreover, copper formate and copper formate hydrate can be listed as particularly preferred copper salts.

When using a metal salt containing silver, i.e., a silver salt as the component (A), it is not particularly limited as long as it is a silver salt as described above. When using a silver salt as the component (A), examples of preferred silver salts include silver nitrate, silver acetate, silver formate, silver oxalate, silver oxide, acetylacetone silver, ethyl acetoacetate silver, silver benzoate, silver bromate, silver bromide, silver carbonate, silver chloride, silver citrate, silver fluoride, silver iodate, silver iodide, silver lactate, silver nitrite, silver perchlorate, silver phosphate, silver sulfate, silver sulfide, and silver trifluoroacetate.

Of these silver salts, from the perspective of forming a metal film (silver film) having low electrical resistance, it is more preferred to use a silver carboxylate, and examples of more preferred silver salts include silver acetate, silver formate, and silver oxalate. Silver formate can be mentioned as a particularly preferred silver salt.

When using a metal salt containing nickel, i.e., a nickel salt as the component (A), it is not particularly limited as long as it is a nickel salt as described above. From the perspective of forming a metal film (nickel film) having low electrical resistance, it is preferred to use a nickel carboxylate, and examples of more preferred nickel salts include nickel acetate, nickel formate, and nickel oxalate. Nickel formate can be mentioned as a particularly preferred nickel salt.

The metal salt as the component (A) is not particularly limited and may be a commercially available product or a product synthesized by a method known in the art. Moreover, nothing prevents use of a product formed in a reaction system by mixing a compound containing a metal ion with at least one of an inorganic anion and an organic anion.

When using a metal salt with a carboxylic acid having reducing power, i.e., a metal carboxylate, as the metal salt as the component (A), nothing prevents further adding no reducing agent because the carboxylic acid having reducing power, which is a counter anion, acts as a reducing agent.

The metal salt as the component (A) is not particularly limited with respect to its purity, but an excessively low purity may have a bad influence on electrical conductivity (electrical resistance characteristic) when a metal film is formed. Therefore, the purity of the metal salt as the component (A) is preferably not less than 90%, more preferably not less than 95%.

When using a metal particle as the component (A), the metal particle is not particularly limited as long as it is a particle made of metal. From the perspective of easily forming a metal film having low electrical resistance, it is more preferred use as the metal particle as the component (A) a metal particle containing at least one metal selected from the group consisting of transition metals of Group 10 and Group 11 of the Periodic Table (palladium, platinum, copper, silver, nickel, and gold). These metals may be in the form of either a simple substance or an alloy with other metals. When these metals are in the form of a simple substance, a preferred metal particle is at least one or a combination of two or more selected from the group consisting of a palladium particle, a platinum particle, a copper particle, a silver particle, a nickel particle, and a gold particle.

Among these, from the perspective of cost aspect, easy availability, and forming a metal film having lower electrical resistance, it is preferred to contain one metal or two or more metal s selected from the group consisting of silver, copper, and nickel. Although nothing prevents using other metal particles, it is more preferred to use the metal particles described above because there is a possibility that a metal particle is oxidized by copper ion when a copper salt, which is a metal salt, is used together.

The average particle diameter of the metal particle to be used as the component (A) is preferably within the range of 5 to 100 nm. If the particle diameter of the metal particle to be used as the component (A) is less than 5 nm, the activity of the metal surface becomes very high, resulting in a possibility of causing an oxidation reaction or allowing the metal particle to dissolve, and an agglomerate may be formed from particles and it may sediment during storage. If the particle diameter exceeds 100 nm, the particle may sediment when being stored for a long time. Therefore, the average particle diameter of the metal particle to be used as the component (A) is preferably within the above-mentioned range.

As a method for measuring the particle diameter of the metal particle to be used as the component (A), a measuring method applied to general particulates can be used. For example, a transmission electron microscope (TEM), a field-emission transmission electron microscope (FE-TEM), a field-emission scanning electron microscope (FE-SEM), and the like can be used. Regarding the value of the average particle diameter, observation is carried out using the above-mentioned microscope, and in the observed field of view, three sites in which the particle diameter is relatively uniform are chosen and photographed at a magnification optimum for particle diameter measurement. In each of the resultant photographs, 100 particles which appear to be present in a largest number are selected and are measured for their diameter with a measuring device such as a scale. The measured diameters are divided by the measurement magnification to calculate particle diameters, which are arithmetically averaged to determine the average particle diameter. A standard deviation can calculated from the particle diameters and the number of the individual metal particles at the time of the above-mentioned observation. A coefficient of variation can be calculated from the following formula on the basis of the above-mentioned average particle diameter and the standard deviation thereof.

Coefficient of variation=(standard deviation/volume average particle diameter)×100(%).

The metal particle to be used as the component (A) is not particularly limited and may be either a commercially available product or a product synthesized by a method known in the art. As a synthesizing method known in the art, for example, a vapor phase process (wet process) in which a synthesis reaction is carried out by physical procedures such as a sputtering process and an in-gas deposition process, and a liquid phase process (wet process) in which a metal compound solution is reduced in the presence of a surface protecting agent to precipitate metal particles are commonly known.

The metal particle used as the component (A) is not particularly limited with respect to its purity, but the purity is preferably not less than 95%, more preferably not less than 99% because an excessively low purity may have a bad influence on electrical conductivity of a formed metal film.

The content of the component (A) in the metal film-forming composition of this embodiment is preferably 1% by mass to 70% by mass, more preferably 5% by mass to 50% by mass, where the overall mass of all the components contained in the metal film-forming composition of this embodiment is taken as 100% by mass. As a result of adjusting the content of the component (A) to 1% by mass to 70% by mass, a metal film has excellent electrical conductivity can be formed. As a result of adjusting the content of the component (A) to 5% by mass to 50% by mass, a metal film having a lower electrical resistance value can be formed by heating at a lower temperature.

Component (B)

The metal film-forming composition according to the present embodiment may comprise an amine compound as the component (B) other than the above-mentioned component (A).

As the amine compound as the component (B), an amine compound represented by at least one of the following formula (1), the following formula (2), and the following formula in a following formula (3) can be used.

Formula 1

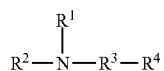

(1)

In the formula (1), $R^1$ and $R^2$ each independently represent a hydrogen atom, an alkyl group having 1 to 18 carbon atoms, or an alicyclic hydrocarbon group having 3 to 18 carbon atoms. $R^3$ represents a single bond, a methylene group, an alkylene group having 2 to 12 carbon atoms, or a phenylene group. $R^4$ represents a hydrogen atom, an alkyl group having 1 to 18 carbon atoms, an alicyclic hydrocarbon group having 3 to 18 carbon atoms, an amino group, a dimethylamino group, or a diethylamino group.

Formula 2

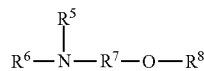

(2)

In the formula (2), $R^5$ and $R^6$ each independently represent a hydrogen atom, an alkyl group having 1 to 18 carbon atoms, or an alicyclic hydrocarbon group having 3 to 18 carbon atoms. $R^7$ represents a methylene group, an alkylene group having 2 to 12 carbon atoms, or a phenylene group. $R^8$ represents, an alkyl group having 1 to 18 carbon atoms, or an alicyclic hydrocarbon group having 3 to 18 carbon atoms. It is noted that, when $R^5$ and $R^6$ are hydrogen atoms, $R^8$ represents a group other than a methyl group and an ethyl group.

Formula 3

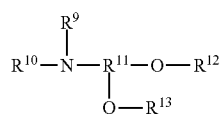

(3)

In the formula (3), $R^9$ and $R^{10}$ each independently represent a hydrogen atom, an alkyl group having 1 to 18 carbon atoms, or an alicyclic hydrocarbon group having 3 to 18 carbon atoms. $R^{11}$ represents a methylene group, an alkylene group having 2 to 12 carbon atoms, or a phenylene group. $R^{12}$ and $R^{13}$ each independently represent, an alkyl group having 1 to 18 carbon atoms, or an alicyclic hydrocarbon group having 3 to 18 carbon atoms.

Examples of the groups $R^1$ and $R^2$ which the amine compound represented by the above formula (1) contains include, in addition to a hydrogen atom, linear alkyl groups, such as a methyl group, an ethyl group, a propyl group, a butyl group, a pentyl group, a hexyl group, a heptyl group, an octyl group, a nonyl group, a decyl group, an undecyl group, a dodecyl group, and a stearyl group, branched alkyl groups, such as an isopropyl group, a sec-butyl group, an isobutyl group, a tert-butyl group, an isopentyl group, a neopentyl group, a tert-pentyl group, a 1-ethylpropyl group, a, 1,1-dimethylpropyl group, a 1,2-dimethylpropyl group, a 1,1,2-trimethylpropyl group, a 1,2,2-trimethylpropyl group, a 1,3-dimethylbutyl group, a 1,5-dimethylhexyl group, a 2-ethylhexyl group, a 4-heptyl group, and a 2-heptyl group, and alicyclic hydrocarbon groups, such as a cyclohexyl group and a cyclopentyl group.

Example of the groups $R^4$ which the amine compound represented by the above formula (1) contains include, in addition to a hydrogen atom, an amino group, a dimethylamino group, and a diethylamino group, linear alkyl groups, such as a methyl group, an ethyl group, a propyl group, a butyl group, a pentyl group, a hexyl group, a heptyl group, an octyl group, a nonyl group, a decyl group, an undecyl group, a dodecyl group, and a stearyl group, branched alkyl groups, such as an isopropyl group, a sec-butyl group, an isobutyl group, a tert-butyl group, an isopentyl group, a neopentyl group, a tert-pentyl group, a 1-ethylpropyl group, a 1,1-dimethylpropyl group, a 1,2-dimethylpropyl group, a 1,1,2-trimethylpropyl group, a 1,2,2-trimethylpropyl group, a 1,3-dimethylbutyl group, a 1,5-dimethylhexyl group, a 2-ethylhexyl group, a 4-heptyl group, and a 2-heptyl group, and alicyclic hydrocarbon groups, such as a cyclohexyl group and a cyclopentyl group.

Specific examples of the amine compound represented by the above formula (1) include methylamine, ethylamine, propylamine, butylamine, pentylamine, hexylamine, heptylamine, octylamine, nonylamine, decylamine, undecylamine, dodecylamine, stearylamine, isopropylamine, sec-butylamine, isobutylamine, tert-butylamine, isopentylamine, neopentylamine, tert-pentylamine, 1-ethylpropylamine, 1,1-dimethylpropylamine, 1,2-dimethylpropylamine, 1,1,2-trimethylpropylamine, 1,2,2-trimethylpropylamine, 1,3-dimethylbutylamine, 1,5-dimethylhexylamine, 2-ethylhexylamine, 4-heptylamine, 2-heptylamine, cyclohexyl amine, cyclopentylamine, ethylenediamine, N-methylethylenediamine, N,N'-dimethylethylenediamine, N,N,N', N'-tetramethylethylenediamine, N-ethylethylenediamine, N,N'-diethylethylenediamine, 1,3-propanediamine, N,N'-dimethyl-1,3-propanediamine, 1,4-butanediamine, N,N'-dimethyl-1,4-butanediamine, 1,5-pentanediamine, N,N'-dimethyl-1,5-pentanediamine, 1,6-hexanediamine, and N,N'-dimethyl-1,6-hexanediamine.

Examples of the groups $R^5$ and $R^6$ which the amine compound represented by the above formula (2) contains include, in addition to a hydrogen atom, linear alkyl groups, such as a methyl group, an ethyl group, a propyl group, a butyl group, a pentyl group, a hexyl group, a heptyl group, an octyl group, a nonyl group, a decyl group, an undecyl group, a dodecyl group, and a stearyl group, branched alkyl groups, such as an isopropyl group, a sec-butyl group, an isobutyl group, a tert-butyl group, an isopentyl group, a neopentyl group, a tert-pentyl group, a 1-ethylpropyl group, a 1,1-dimethylpropyl group, a 1,2-dimethylpropyl group, a 1,1,2-trimethylpropyl group, a 1,2,2-trimethylpropyl group, a 1,3-dimethylbutyl group, a 1,5-dimethylhexyl group, a 2-ethylhexyl group, a 4-heptyl group, and a 2-heptyl group, and alicyclic hydrocarbon groups, such as a cyclohexyl group and a cyclopentyl group.

Example of the group $R^8$ which the amine compound represented by the above formula (2) contains include, linear alkyl groups, such as a methyl group, an ethyl group, a propyl group, a butyl group, a pentyl group, a hexyl group, a heptyl group, an octyl group, a nonyl group, a decyl group, an undecyl group, a dodecyl group, and a stearyl group, branched alkyl groups, such as an isopropyl group, a sec-butyl group, an isobutyl group, a tert-butyl group, an isopentyl group, a neopentyl group, a tert-pentyl group, a 1-ethylpropyl group, a 1,1-dimethylpropyl group, a 1,2-dimethylpropyl group, a 1,1,2-trimethylpropyl group, a 1,2,2-trimethylpropyl group, a 1,3-dimethylbutyl group, a 1,5-dimethylhexyl group, a 2-ethylhexyl group, a 4-heptyl group, and a 2-heptyl group, and alicyclic hydrocarbon groups, such as a cyclohexyl group and a cyclopentyl group. It is noted that, when both $R_5$ and $R_6$ are hydrogen atoms, $R_8$ represents a group other than a methyl group and an ethyl group.

Specific examples of the amine compound represented by the above formula (2) include methoxy(methyl)amine, 2-methoxyethylamine, 3-methoxypropylamine, 4-methoxybutylamine, ethoxy(methyl)amine, 2-ethoxyethylamine, 3-ethoxypropylamine, 4-ethoxybutylamine, propoxymethylamine, 2-propoxyethylamine, 2-isopropoxypropylamine, 3-isopropoxypropylamine, 2-propoxypropylamine, 3-propoxypropylamine, 4-propoxybutylamine, butoxymethylamine, butoxyethylamine, 2-butoxypropylamine, 3-butoxypropylamine, 3-(2-ethylhexyloxy)propylamine, 3-isobutoxypropylamine, 4-butoxybutylamine, and oxybis(ethylamine).

Examples of the groups $R^9$ and $R^{10}$ which the amine compound represented by the above formula (3) contains include, in addition to a hydrogen atom, linear alkyl groups, such as a methyl group, an ethyl group, a propyl group, a butyl group, a pentyl group, a hexyl group, a heptyl group, an octyl group, a nonyl group, a decyl group, an undecyl group, a dodecyl group, and a stearyl group, branched alkyl groups, such as an isopropyl group, a sec-butyl group, an isobutyl group, a tert-butyl group, an isopentyl group, a neopentyl group, a tert-pentyl group, a 1-ethylpropyl group, a 1,1-dimethylpropyl group, a 1,2-dimethylpropyl group, a 1,1,2-trimethylpropyl group, a 1,2,2-trimethylpropyl group, a 1,3-dimethylbutyl group, a 1,5-dimethylhexyl group, a 2-ethylhexyl group, a 4-heptyl group, and a 2-heptyl group, and alicyclic hydrocarbon groups, such as a cyclohexyl group and a cyclopentyl group.

Examples of the groups $R^{12}$ and $R^{13}$ which the amine compound represented by the above formula (3) contains include, linear alkyl groups, such as a methyl group, an ethyl group, a propyl group, a butyl group, a pentyl group, a hexyl group, a heptyl group, an octyl group, a nonyl group, a decyl group, an undecyl group, a dodecyl group, and a stearyl group, branched alkyl groups, such as an isopropyl group, a sec-butyl group, an isobutyl group, a tert-butyl group, an isopentyl group, a neopentyl group, a tert-pentyl group, a 1-ethylpropyl group, a 1,1-dimethylpropyl group, a 1,2-dimethylpropyl group, a 1,1,2-trimethylpropyl group, a 1,2,2-trimethylpropyl group, a 1,3-dimethylbutyl group, a 1,5-dimethylhexyl group, a 2-ethylhexyl group, a 4-heptyl group, and a 2-heptyl group, and alicyclic hydrocarbon groups, such as a cyclohexyl group and a cyclopentyl group.

Specific examples of the amine compound represented by the above formula (3) include aminoacetaldehyde diethylacetal.

In the metal film-forming composition of this embodiment, it is preferred to use as the component (B) one compound or a combination of two or more compounds compatible with each other selected from the group consisting of amine compounds represented by at least one general formula of the above general formula (1), the above general formula (2), and the above general formula (3). The component (B) is not particularly limited with respect to the way to obtain it, and commercially available products may be used.

The purity of the component (B) is not particularly limited, but, while keeping in mind that the metal film-forming composition is to be used in the electronic material field, it is preferably not less than 95%, more preferably not less than 99% so that the content of impurities in the metal film can be reduced.

The content of the component (B) may be adjusted to not more than 99% by mass and is preferably 0.1% by mass to 99% by mass, more preferably 1% by mass to 90% by mass, even more preferably 2% by mass to 80% by mass, where the overall mass of all the components contained in the metal film-forming composition of this embodiment is taken as 100% by mass. As a result of adjusting the content of the component (B) to 0.1% by mass to 99% by mass, a metal film having excellent electrical conductivity can be formed. As a result of adjusting the content of the component (B) to 1% by mass to 90% by mass, a metal film having a lower electrical resistance value can be formed by heating at a lower temperature. As a result of adjusting to 2% by mass to 80% by mass, formation of a metal film having a low electrical resistance value can be attained and a metal film-forming composition excellent in productivity can be prepared.

Component (C)

The metal film-forming composition of this embodiment may comprise a solvent or a dispersing medium (henceforth collectively referred to as solvent) as an optional component (C) in addition to the component (A) and the component (B) as described above. Inclusion of the solvent in the metal film-forming composition makes it easy to control the viscosity of the metal film-forming composition according to a coating method and makes it possible to form a metal film having stable and uniform physical properties.

The solvent is not particularly limited as long as it is one capable of dissolving or dispersing the individual components in the metal film-forming composition. Examples thereof include one liquid or two or more compatible liquids selected from among water, alcohols, ethers, esters, aliphatic hydrocarbons, and aromatic hydrocarbons.

Specific example of alcohols that can be used as a solvent include methanol, ethanol, n-propyl alcohol (1-propanol), i-propyl alcohol, n-butyl alcohol (1-butanol), i-butyl alcohol, sec-butyl alcohol, pentanol, hexanol, heptanol, octanol, nonyl alcohol, decanol, cyclohexanol, benzyl alcohol, terpineol, and dihydroterpineol.

Examples of the ethers include (poly)alkylene glycol alkyl ethers such as hexyl methyl ether, diethylene glycol dimethyl ether, diethylene glycol diethyl ether, diethylene glycol methyl ethyl ether, triethylene glycol dimethyl ether, triethylene glycol diethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, tripropylene glycol dimethyl ether, and tripropylene glycol diethyl ether, tetrahydrofuran, tetrahydropyrane, and 1,4-dioxane.

Examples of the esters include methyl formate, ethyl formate, butyl formate, methyl acetate, ethyl acetate, butyl acetate, methyl propionate, ethyl propionate, butyl propionate, γ-butyrolactone, propylene glycol methyl ether acetate, propylene glycol ethyl ether acetate, and dipropylene glycol methyl ether acetate.

Examples of the aliphatic hydrocarbons include n-pentane, n-hexane, n-heptane, n-octane, n-nonane, n-decane, n-undecane, n-dodecane, tetradecane, cyclohexane, and decalin.

Examples of the aromatic hydrocarbons include benzene, toluene, xylene, ethylbenzene, n-propylbenzene, i-propylbenzene, n-butylbenzene, mesitylene, tetralin, chlorobenzene, and dichlorobenzene.

Among these solvents, ethers are preferred from the perspective of ease of performing control of the viscosity of a metal film-forming composition.

The content of a solvent that is component (C) is within the range of 0% by mass to 95% by mass, preferably within the range of 0% by mass to 70% by mass, more preferably within the range of 0% by mass to 50% by mass, where the overall mass of all the components contained in the metal film-forming composition of this embodiment is taken as 100% by mass.

Other Components

The metal film-forming composition of this embodiment may contain other arbitrary components in addition to the above-described component (A) unless the effect of the present invention is impaired. As such other arbitrary components, the composition may contain at least one of formic acid and ammonium formate, and moreover it may contain a dispersing agent, an antioxidant, a concentration regulator, a surface tension regulator, a viscosity regulator, a coating film-forming aid, an adhesion aid, etc.

Formic acid and ammonium formate, which are arbitrary components, have an effect of promoting a reduction reaction during forming a metal film from the metal film-forming composition of this embodiment and can promote the formation of a metal film with a desired electrical resistance characteristic.

As the formic acid and the ammonium formate which can be contained in the metal film-forming composition of this embodiment, commercially available products may be used and the formic acid and, for example, how to obtain them is not particularly limited.

The formic acid and the ammonium formate are not particularly limited regarding their purity. At a low purity, however, there is a fear that in forming a metal film, the electrical conductivity of the metal film may be deteriorated. Therefore, the purity of the formic acid and the ammonium formate is preferably not less than 95%, more preferably 99% or more.

Although the total content of the formic acid and the ammonium formate in the metal film-forming composition of this embodiment is not particularly limited, it is preferably within the range of 0% by mass to 50% by mass, more preferably within the range of 0% by mass to 20% by mass, where the overall mass of all the components contained in the metal film-forming composition of this embodiment is taken as 100% by mass. Even if formic acid and ammonium formate are added so that their total content may be greater than 50% by mass, an effect as much as it corresponds to the content is not obtained. Moreover, the amount of metal formation per unit mass of the metal film-forming composition decreases and it is feared that a metal film with a desired characteristic cannot be formed at a high production efficiency.

The metal film-forming composition of this embodiment may also contain components other than the formic acid etc. described above as an arbitrary component unless the effect of the present invention is impaired. The arbitrary components other than formic acid etc. which the metal film-forming composition of this embodiment may contain are not particularly limited as long as they have desired characteristic and they do not inhibit a reaction of metal film formation caused by component (A). For example, a solvent may be selected from among organic solvents that dissolve the above-mentioned components and that fail to react with the components and may be contained as an arbitrary component. Moreover, the addition of such an organic solvent makes it possible to prepare a metal film-forming composition so that the composition may have a desired concentration, surface tensile, and viscosity or improve adhesion to a barrier layer or the like.

Although the content of the arbitrary components other than formic acid and the ammonium formate in the metal film-forming composition of this embodiment is not particularly limited, it is preferably within the range of 0% by mass to 50% by mass, more preferably within the range of 0% by mass to 20% by mass, where the overall mass of all the components contained in the metal film-forming composition of this embodiment is taken as 100% by mass. Even if other components are added so that their content may be greater than 50% by mass, an effect of other components as much as it corresponds to the content is not obtained. Moreover, the amount of metal formation per unit mass of the metal film-forming composition decreases and it is feared that a metal film with a desired characteristic cannot be formed at a high production efficiency.

Next, the preparation of the metal film-forming composition including the above-mentioned components according to the present embodiment will be described.

Preparation of Film-Forming Composition

The metal film-forming composition of this embodiment can be prepared and produced easily by mixing the above-described component (A), the component (B) according to necessity, and other optional components. Also when the metal film-forming composition of this embodiment contains a solvent as the component (C), it can be prepared and produced easily by mixing the component (A) and the component (C) as well as the component (B) and other optional components according to necessity.

In the preparation of the metal film-forming composition of this embodiment, when an amine compound as the component (B) and a solvent as the component (C) are added, the addition of the component (C) may be performed after mixing the above-described component (A) and the component (B). The solvent to be added is not particularly limited as long as it can dissolve or disperse the component (A) and the component (B) as described above. One that can dissolve or disperse the component (B) is preferred.

In the preparation of the metal film-forming composition of this embodiment, when formic acid, etc. previously mentioned, a dispersing agent, an antioxidant, a concentration regulator, a surface tension regulator, a viscosity regulator, or the like are included as other optional components, such other optional components may be added, for example, after mixing the component (A) and the component (B) or after mixing the component (A), the component (B), and the component (C). Optional components such as a dispersing agent, an antioxidant, a concentration regulator, a surface tension regulator, a viscosity regulator, and an adhesion aid, adjust the component concentration, the surface tension, the viscosity, and the like of the metal film-forming composition of this embodiment or enhance adhesion to a barrier layer and the like.

The mixing method used in the preparation of the metal film-forming composition of this embodiment is not particularly limited, examples thereof include stirring with stirring a blade, stirring with a stirrer and a stirring bar, stirring with a boiler, and a method using an ultrasonic homogenizer, a dissolver, a bead mill, a paint shaker, or a stirring-defoaming apparatus. Regarding the conditions for mixing, in the case of, for example, stirring with a stirring blade, the rotation speed of the stirring blade is usually within the range of 1 rpm to 4000 rpm, preferably within the range of 10 rpm to 2000 rpm.

Next, a description is made with the formation of a metal film using the metal film-forming composition of this embodiment and a metal film to be formed.

Formation of Metal Film

In forming a metal film using the metal film-forming composition of this embodiment, a coating film is first formed by applying the metal film-forming composition onto an appropriate desired substrate. Subsequently, the coating film is heated, thereby forming a metal film on the substrate.

The heating of the coating film at this time can be performed under the atmosphere, or under a non-oxidative atmosphere using and inert gas, such as nitrogen gas, helium gas, and argon gas, or an atmosphere with an oxygen concentration of 500 ppm or less, or in a vacuum. A metal film can be formed by subjecting the metal film-forming composition of the above-described embodiment simply to heating for metal film formation. When the metal film-forming composition contains a metal salt as the component (A), it is not necessary to heat under a reductive atmosphere using a reductive gas such as hydrogen gas because the metal ion of the metal salt undergoes a reduction reaction to produce a metal particle.

The substrate on which the coating film of the metal film-forming composition is formed is not particularly limited and one known in the art may be used.

Examples of this substrate include organic substrates such as resin, and inorganic substrates such as metal, metal alloy, nonmetal, ceramics, and glass, and more specifically include resin substrates such as epoxy resin, polyimide resin, acrylic resin, styrenic resin, vinyl chloride resin, polyester resin (polyethylene terephthalate, polytrimethylene terphthalate, polybutylene terephthalate, polyethylene naphthalate, and polybutylene naphthalate), polyacetal resin, and cellulose derivatives, metal substrates such as copper, iron, silver, gold, platinum, aluminum, nickel, titanium, tantalum, cobalt, tungsten, ruthenium, and lead, metal alloy substrates such as duralumin and stainless steel, nonmetallic substrates such as carbon, silicon, and gallium, ceramic substrates such as alumina, titania, tin oxide, yttrium oxide, barium titanate, strontium titanate, sapphire, zirconia, gallium nitride, silicon nitride, titanium nitride, tantalum nitride, and polysilicon, glass substrates such as soda glass, borosilicate glass, silica glass, quartz glass, and chalcogen glass, and organic inorganic composite substrates such as glass epoxy resin.

Examples of the method of applying the metal film-forming composition of this embodiment include printing methods such as ink jet printing, gravure printing, a gravure offset printing process, a reverse offset printing process, flexographic printing, (silk) screen printing, and relief printing, and coating processes such as a spin coating process, a spray coating process, a bar coating process, a casting process, a dip coating process, and a roll coater process.

In the case of using a printing process, a desired pattern can be drawn directly. As a result, it becomes possible to form a conductive layer to be applied to a plating process by using a metal film formed by heating a coating film formed on a suitable substrate. In the case of using a spin coating process or the like, since a uniform solid coating film is formed on the substrate, it becomes possible to form a uniform solid metal film by heating the coating film. Moreover, in the case of using a spin coating process or the like, since it becomes possible, even if a through hole or a blind via hole has been formed in a substrate, to form an almost uniform coating film on an inner surface of the through hole or the blind via hole and an upper surface of the substrate, it becomes possible to form an almost conformal metal film by heating the coating film.

The applied amount of the metal film-forming composition may be suitably adjusted according to the thickness of a desired metal film. It is preferred to adjust the viscosity of the metal film-forming composition according to a coating method, wettability with a substrate (the magnification of the surface energy of the substrate), etc. The viscosity of the metal film-forming composition can be adjusted, in the case of including a solvent as component (C), by appropriately choosing the type and the content of the component (C). When including an amine compound as component (B) in the metal film-forming composition, the viscosity of the metal film-forming composition can be adjusted also by appropriately choosing the type and the content of the component (B).

The temperature at the time of heating a coating film obtained by applying the metal film-forming composition of this embodiment may be appropriately set depending on whether a metal salt is contained as the component (A) previously mentioned or whether a metal particulate is contained. The heating temperature in the case where the metal film-forming composition contains a metal salt as the component (A) may be any temperature at which the metal salt of the component (A) is reduced and unnecessary organic substances are decomposed and volatilized; for example, it is preferably chosen within the range of 50° C. to 300° C., more preferably within the range of 50° C. to 250° C., and further preferably within the range of 50° C. to 200° C. If the heating temperature is lower than 50° C., the reduction reaction of the metal salt does not proceed completely and remarkable remaining of unnecessary organic substances may occur, whereas if the heating temperature exceeds 300° C., there is a fear that a substrate made of an organic material cannot be used or that a circuit part that has already been formed is damaged. If the heating temperature is not higher than 250° C., it becomes possible to choose and use a substrate made of an organic material. If the heating temperature is not higher than 200° C., a desired substrate can be used by selecting it from the group of a wider variety of substrates including substrates made of organic materials.

On the other hand, the heating temperature in the case of containing a metal particulate as the component (A) is preferably set to a temperature at which metal particulates of the component (A) are sintered or fused together. When the average particle diameters of the metal particulate is several nanometers to several tens of nanometers, the melting point thereof becomes lower than that of bulk metal, and sintering and fusion of particulates will occur by heating to a relatively low temperature as low as about 300° C. When the average particle diameter of the metal particulate is about 100 nm, sintering or fusion of the particulate will occur on heating at a relatively lower temperature.

The heating time is not particularly limited and may be chosen in view of the types of components in the metal film-forming composition including the component (A) as well as the component (B), the component (C), and other optional components which are added according to necessity, and the electrical conductivity (electrical resistance value) of a desired metal film. When a relatively low heating temperature as low as about 200° C. or lower is chosen, the heating time is preferably set to about 5 minutes to about 100 minutes.

When a metal film obtained by heating a coating film of a metal film-forming composition is used as a seed layer for plating treatment for forming a contact plug, it is preferred to adjust the viscosity of the metal film-forming composition to 1 Pa·s or less and the metal concentration to 5 to 50% by mass as described in embodiment 1 through embodiment 4. Here, the metal concentration of the metal film-forming composition means the proportion of the component (A) relative to the metal film-forming composition. In this case, it is preferred to form a metal film by heating the coating film of the metal film-forming composition to 100 to 200° C. in an atmosphere with an oxygen concentration of 500 ppm or less or vacuum.

The thickness and the step coverage of a metal film obtained by heating a coating film of a metal film-forming composition vary depending upon the composition of the metal film-forming composition, the applied amount of the metal film-forming composition, the viscosity of the metal film-forming composition, the metal concentration of the metal film-forming composition, the wettability between the metal film-forming composition and a substrate, application conditions, and the like. It perspective of forming a metal film having good step coverage and having a desired thickness, it is desirable to determine in advance preferred ranges of the composition, viscosity and metal concentration of the metal film-forming composition and application conditions in view of the wettability with a substrate.

Figure 13:
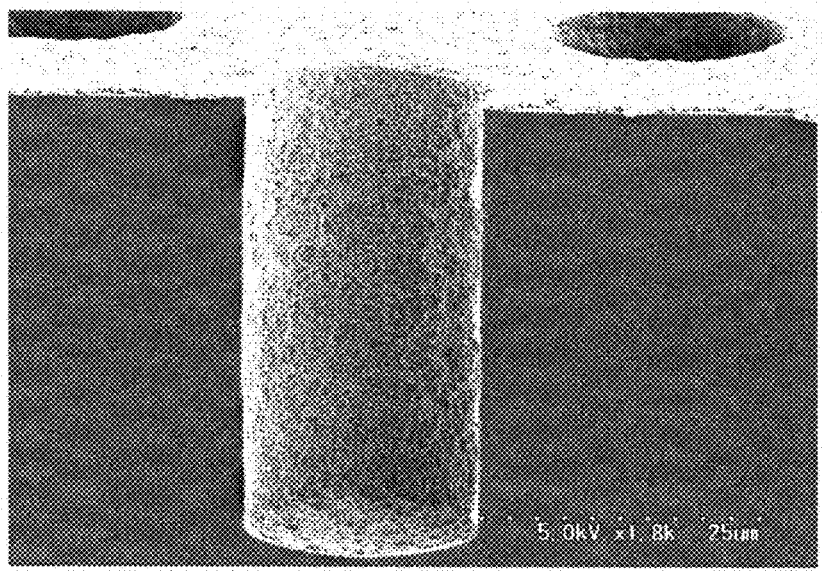
FIG. 13 is a scanning electron micrograph showing a cross-sectional shape of a copper film, which was formed by heating a coating film obtained by applying a metal film-forming composition by a spin coating process onto a silicon wafer provided with blind via holes.
Figure 14:
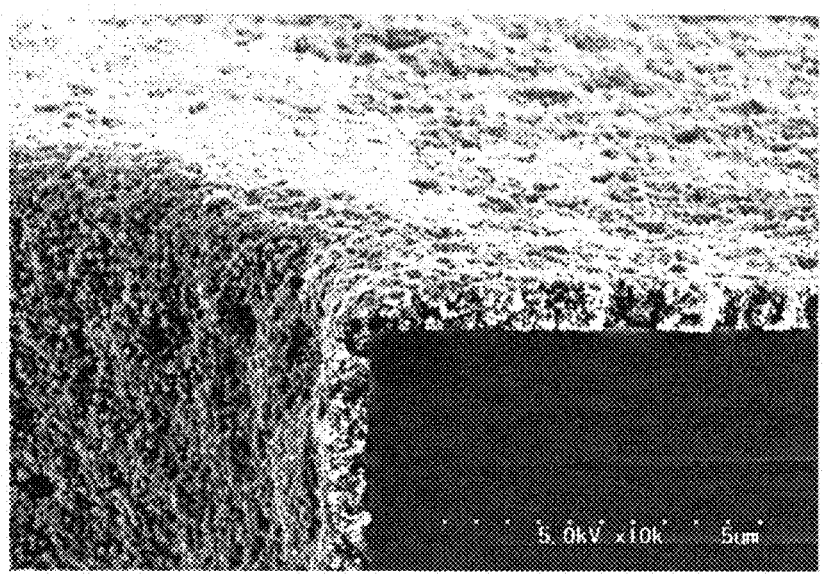
FIG. 14 is another scanning electron micrograph showing a cross-sectional shape of a copper film, which was formed by heating a coating film obtained by applying a metal film-forming composition by a spin coating process onto a silicon wafer provided with blind via holes.
Figure 15:
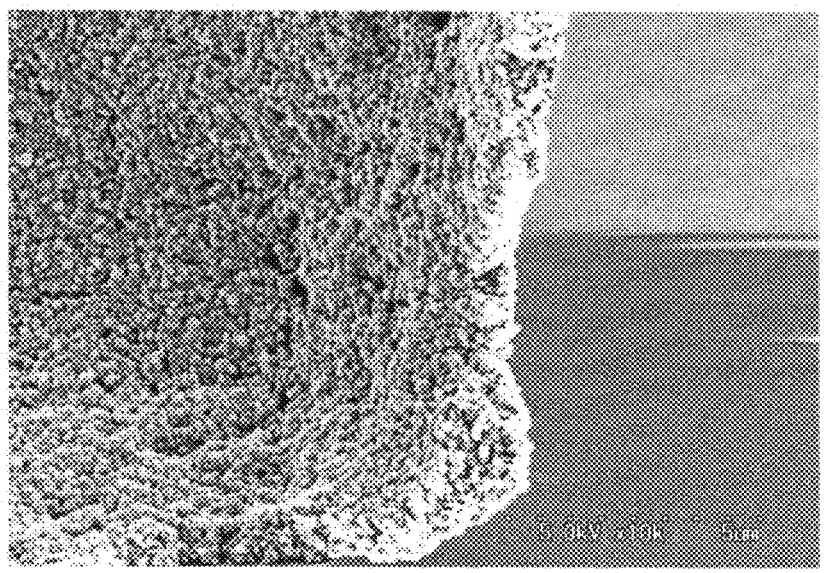
FIG. 15 is another scanning electron micrograph showing a cross-sectional shape of a copper film, which was formed by heating a coating film obtained by applying a metal film-forming composition by a spin coating process onto a silicon wafer provided with blind via holes.

For example, in the case of applying a metal film-forming composition by a spin coating process to a silicon wafer provided with blind via holes, thereby obtaining a coating film, and then heating this coating to form a metal film, a metal film that is almost uniform in thickness and good in step coverage as shown, for example, in FIGS. 13 to 15 can be formed by appropriately adjusting the composition of the metal film-forming composition, the applied amount of the metal film-forming composition, the viscosity of the metal film-forming composition, the metal concentration of the metal film-forming composition, etc. That is, a conformal metal film can be formed.

Each of FIGS. 13 to 15 is a scanning electron micrograph showing a cross-sectional shape of a copper film, which was formed by heating a coating film obtained by applying a metal film-forming composition by a spin coating process onto a silicon wafer provided with blind via holes. FIG. 13 shows a cross-sectional shape of a copper film in an entire blind via hole, FIG. 14 shows a cross-sectional shape of a copper film at an upper end portion of a blind via hole and in the vicinity thereof, and FIG. 15 shows a cross-sectional shape of a copper film at a lower end portion of a blind via hole and in the vicinity thereof.

The blind via holes formed in the silicon wafer are 15 μm in opening diameter and 50 μm in depth, and the viscosity of the metal film-forming composition is 160 mP·s. The rotation speed at the time of a main low tension in spin coating is 500 rpm and the continuation time is 10 seconds. The heating of a coating film was performed in a nitrogen gas flow at 200 to 230° C. for 10 minutes.

As clear from FIGS. 13 to 15, the copper film formed under the above-described conditions is a sintered film of copper particles, and the copper film is almost uniform in thickness from the bottom to the upper end portion of a blind via hole and further to the upper surface of the silicon wafer. In other words, the copper film has good step coverage and is formed in approximately conformal. This metal film has an average thickness of 0.7 μm and a specific resistivity of 20 μΩ·cm.

As described above, use of the metal film-forming composition of this embodiment makes it possible to easily form a metal film having good electrical resistance characteristic and makes it easy to form a metal film in good step coverage. Even if a through hole or a blind via hole is large in aspect ratio, a metal film can easily be formed in good step coverage within the through hole or the blind via hole.

EXAMPLES

Embodiments of the present invention will be described more specifically below with reference to examples. However, the present invention is not to be limited to these Examples. In the Examples, the viscosity was measured with an E-type viscometer (manufactured by Toki Sangyo Co., Ltd.).

First Example

A glass reactor equipped with a cooling jacket and a stirrer was charged with 33 parts by weight of copper formate tetrahydrate and 67 parts by weight of n-octylamine. Subsequently, mixing was performed at 300 rpm for 20 hours while controlling the solution temperature at 30° C., and thus a metal film-forming composition 1 having a copper concentration in terms of atom of 9.3% by mass was prepared. The viscosity of the metal film-forming composition 1 was 390 mPa·s.

Second Example

A metal film-forming composition 2 having a copper concentration in terms of atom of 9.1% by mass was prepared by the same operations as in Example 1 except that the copper formate tetrahydrate was replaced by 22 parts by weight of anhydrous copper formate and the n-octylamine was replaced by 78 parts by weight of 2-ethylhexylamine. The viscosity of the metal film-forming composition 2 was 100 mPa·s.

Third Example

A metal film-forming composition 3 having a copper concentration in terms of atom of 9.0% by mass was prepared by the same operations as in Example 1 except that the copper formate tetrahydrate was replaced by 23 parts by weight of nickel formate and that 77 parts by weight of n-octylamine were used. The viscosity of the metal film-forming composition 3 was 150 mPa·s.

Fourth Example

A metal film-forming composition 4 was prepared by the same operations as in Example 1 except that 7 parts by weight of nickel formate, 15 parts by weight of anhydrous copper formate, 58 parts by weight of n-octylamine, and 20 parts by weight of 3-ethoxypropylamine were used. The viscosity of the metal film-forming composition 4 was 320 mPa·s.

Fifth Example

A metal film-forming composition 5 was prepared by the same operations as in Example 1 except that 22 parts by weight of anhydrous copper formate, 55 parts by weight of n-octylamine, and 23 parts by weight of diethylene glycol dimethyl ether were used and 0.5 parts by weight of BYK370 (produced by BYK-Chemie, solid concentration: 25% by mass) was externally added as a surface conditioner. The viscosity of the metal film-forming composition 5 was 90 mPa·s.

Sixth Example

A glass reactor equipped with a glass reflux condenser and a stirrer was charged with 32.3 parts by weight of 1-butanol, 46.2 parts by weight of 2-ethylhexylamine, 3.2 parts by weight of oleic acid, and 18.3 parts by weight of anhydrous copper formate, followed by stirring until complete dissolution, then heating to 100° C. in an oil bath, and stirring for 60 minutes. Thus, a black copper particulate dispersion was obtained. After allowing the copper particulate dispersion to cool to room temperature, 100 parts by weight of methanol was added and then a supernatant liquid was separated and removed by centrifugal separation, affording 10.2 parts by weight of a solid comprising copper nanoparticles as a main component. Analysis with a transmission electron microscope (TEM) revealed that the average particle diameter of the copper nanoparticles was 54 nm. To 4.0 parts by weight of the resultant solid comprising copper nanoparticles as a main component, 0.4 parts by weight of oleic acid, 0.3 parts by weight of octylamine, 3.5 parts by weight of n-octane, 3.5 parts by weight of butanol, and 0.1 parts by weight of Solsperse 24000 (produce by The Lubrizol Corporation) were mixed by means of a planetary stirring-defoaming apparatus, and thus a metal film-forming composition 6 having a copper concentration in terms of atom of 33% by mass was obtained. The viscosity of the metal film-forming composition 6 was 75 mPa·s.

Seventh Example

A metal film-forming composition 7 having a copper concentration in terms of atom of 4.4 wt % was prepared by the same operations as in Example 1 except that the copper formate tetrahydrate of Example 1 was replaced by 10.5 parts by weight of anhydrous copper formate and the amount of n-octylamine was increased from 67 parts by weight to 89 parts by weight and 0.5 parts by weight of BYK370 (produced by BYK-Chemie, solid concentration: 25% by mass) was externally added. The viscosity of the metal film-forming composition 7 was 80 mPa·s.

Eighth to Fourteenth Examples

Formation of Through-Silicon Wiring Board

A substrate having the structure depicted in FIG. 1A and FIG. 1B was prepared according to the steps depicted in FIGS. 2A to 2D and FIGS. 3A to 3E. First, a silicon nitride film was formed on the upper surface of a silicon wafer substrate by a plasma CVD process. A resist was patterned thereon by photolithography and a blind via hole-shaped mask material layer was formed by subsequent wet etching. Next, blind via holes having an opening diameter of 10 μm and a depth of 100 μm were formed from the mask material layer-formed surface into the silicon wafer substrate by a reactive ion etching process. Then, the mask material layer, i.e., the silicon nitride film, was removed by wet etching.

Next, a silicon oxide film was formed on the upper surface of the silicon wafer substrate and on the inner surfaces of the blind via holes by a plasma CVD process. Moreover, a titanium film, which was a barrier layer, was formed by a PVD process.

Each of the metal film-forming compositions 1 to 7 of Examples 1 to 7 was spin coated on the blind via hole substrate provided with a titanium film and sintered for 30 minutes at a predetermined temperature with a hot plate under a nitrogen flow. Thus, a sintered film of copper particles as a metal film 23 (see FIG. 2D) that would serve as a base material of a seed layer S was formed on the upper surface of the blind via hole-formed surface and the inner surfaces of the blind via holes. The average thickness of the metal film 23 on the upper surface of the blind via hole-formed surface was 300 nm. The surface resistance value of the upper surface of the blind via hole substrate with a metal film was measured using a 4-pin probe resistivity meter (trade name: Model sigma-5, manufactured by NPS). An adhesion test was performed in accordance with the tape testing method disclosed in JIS H-8504. Evaluation was performed on the following three-point scale of A to C.

A: No metal film attached to the adhesive surface of a tape.
B: Part of a metal film attached to the adhesive surface of a tape.
C: The whole of a metal film attached to the adhesive surface of a tape.

The sintering temperature conditions and the evaluated results are shown in Table 1.

Next, under the conditions disclosed in Example 2 of Japanese Patent No. 3964263, electrolytic copper plating treatment was applied to a blind via hole-formed surface, thereby filling up the blind via hole with copper, and then under the conditions disclosed in Example 1 of Japanese Patent No. 3837277, the electrodeposited copper layer was polished by a chemical mechanical polishing (CMP) method and thereby the upper surface of the blind via hole was planarized. Subsequently, the surface opposite the blind via hole-formed surface (i.e., the lower surface of the silicon wafer substrate) was polished by the CMP process until the lower surface of the barrier layer exposed completely. Subsequently, a silicon oxide film was formed by a plasma CVD process and then a silicon oxide film overlapping in plan view the electrodeposited copper layer located within the blind via hole was removed by a wet etching process, and then an aluminum layer was formed as a lower common electrode by a PVD process.

Subsequently, the electrodeposited copper layer/the metal film 23/the barrier layer other than regions allowed to remain as upper wires were removed by wet etching to form upper wires, and thereby a through-silicon wiring board was obtained. By measuring the electrical resistance value between a lower common electrode and an upper wire of the through-silicon wiring board, the electrical continuity of twenty contact plugs formed was checked. The resistance value from the measuring terminal of an upper wire to a contact plug was corrected and thereby the resistance value between the top and bottom of a contact plug was calculated. The result summarized with respect to resistance value range is shown in Table 2.

A contact plug portion of each substrate was sectioned by focused ion beam (FIB) processing and observed with a high resolution scanning electron microscope (SEM), and thereby the packing, namely, the state of void generation was evaluated.
Evaluation was performed on the following two-point scale.
  ◯: No voids were observed and good connection has been formed.
  Δ: Voids generated in some portions.
The evaluated results are also shown in Table 2.

TABLE 1

| | Metal film-forming Composition | Sintering Temperature (Degrees Celsius) | Performance Test for Seed Layer | |
|---|---|---|---|---|
| | | | Surface Resistance Value (Ω/□) | Adhesion Test |
| Example 8 | 1 | 180 | 1.2 | A |
| Example 9 | 2 | 180 | 1.3 | A |
| Example 10 | 3 | 230 | 2.1 | A |
| Example 11 | 4 | 230 | 1.5 | A |
| Example 12 | 5 | 180 | 1.2 | A |
| Example 13 | 6 | 200 | 1.3 | A |
| Example 14 | 7 | 180 | 1.1 | A |

TABLE 2

| | Resistance Value of Contact Plug | | | Packing of Cross-section |
|---|---|---|---|---|
| | <0.1Ω | 0.1~10Ω | 10Ω< | of through part |
| Example 8 | 20 | 0 | 0 | ◯ |
| Example 9 | 20 | 0 | 0 | ◯ |

TABLE 2-continued

| | Resistance Value of Contact Plug | | | Packing of Cross-section |
|---|---|---|---|---|
| | <0.1Ω | 0.1~10Ω | 10Ω< | of through part |
| Example 10 | 20 | 0 | 0 | ◯ |
| Example 11 | 20 | 0 | 0 | ◯ |
| Example 12 | 20 | 0 | 0 | ◯ |
| Example 13 | 20 | 0 | 0 | ◯ |
| Example 14 | 0 | 3 | 17 | Δ |

Fifteenth to Twenty-First Examples

Formation of Through-Silicon Wiring Board

A substrate having the structure depicted in FIG. 7A and FIG. 7B was prepared according to the steps depicted in FIGS. 8A to 8D and FIGS. 9A to 9E. First, a silicon nitride film was formed on the upper surface of a silicon wafer substrate by a plasma CVD process. A resist was patterned thereon by photolithography and a blind via hole-shaped mask material layer was formed by subsequent wet etching. Next, blind via holes having an opening diameter of 10 um and a depth of 100 um were formed from the mask material layer-formed surface into the silicon wafer substrate by a reactive ion etching process. Then, the mask material layer, i.e., the silicon nitride film, was removed by wet etching.

Next, a silicon oxide film was formed on the upper surface of the silicon wafer substrate and on the inner surfaces of the blind via holes by a plasma CVD process. Moreover, a titanium film, which was a barrier layer, was formed by a PVD process. Subsequently, copper was deposited by a PVD process to form a bottom seed layer BS and an upper conductive film UM (see FIG. 8D and FIG. 9A) simultaneously, and thus a blind via hole substrate having the bottom seed layer BS and the upper conductive film UM was prepared. In this substrate, the thickness of the copper film was adjusted so that the bottom seed layer BS might be 10 nm thick and the upper conductive film UM might be 30 nm thick, and the presence of a copper film was not observed at a via inner wall portion.

Each of the metal film-forming compositions 1 to 7 of the First Example to the Seventh Example was applied by a spin coating process on the blind via hole substrate provided with a bottom seed layer BS and sintered for 30 minutes at a predetermined temperature with a hot plate under a nitrogen flow. Thus, a sintered film of copper particles as a metal film 53 (see FIG. 8D) that would serve as a base material of a main seed layer MS was formed on the upper surface of the blind via hole-formed surface and the inner surfaces of the blind via holes. Conditions were adjusted so that the average thickness of a main seed layer MS might be 250 nm at an upper surface and 60 nm on an inner wall. The surface resistance value of the upper surface of the blind via hole substrate with a metal film, in the same fashion as the eighth example to the fourteenth example, was measured using a 4-pin probe resistivity meter (trade name: Model sigma-5, manufactured by NPS). Further, an adhesion test was performed in accordance with the tape testing method disclosed in JIS H-8504, in the same fashion as the eighth example to the fourteenth example. The evaluation was also performed in the same fashion as the eighth Example to the fourteenth example. The sintering temperature conditions and the evaluated results are shown in Table 3.

Next, under the conditions disclosed in Example 2 of Japanese Patent No. 3964263, electrolytic copper plating treatment was applied to a blind via hole-formed surface, thereby filling up the blind via hole with copper, and then under the conditions disclosed in Example 1 of Japanese Patent No. 3837277, the electrodeposited copper layer was polished by a chemical mechanical polishing (CMP) method and thereby the upper surface of the blind via hole was planarized. Subsequently, the surface opposite the blind via hole-formed surface (i.e., the lower surface of the silicon wafer substrate) was polished by the CMP process until the lower surface of the barrier layer exposed completely. Subsequently, a silicon oxide film was formed by a plasma CVD process and then a silicon oxide film overlapping in plan view the electrodeposited copper layer located within the blind via hole was removed by a wet etching process, and then an aluminum layer was formed as a lower common electrode by a PVD process.

Subsequently, the electrodeposited copper layer/upper conductive film/the barrier layer other than regions allowed to remain as upper wires were removed by wet etching to form upper wires, and thereby a through-silicon wiring board was obtained. Next, in the same fashion as the eighth to fourteenth examples, by measuring the electrical resistance value between a lower common electrode and an upper wire of the through-silicon wiring board, the electrical continuity of twenty contact plugs formed was checked. The resistance value from the measuring terminal of an upper wire to a contact plug was corrected and thereby the resistance value between the top and bottom of a contact plug was calculated. The result summarized with respect to resistance value range is shown in Table 4.

Further, a contact plug portion of each substrate was sectioned by focused ion beam (FIB) processing, and in the same fashion as the eighth to fourteenth examples, observed with a high resolution scanning electron microscope (SEM), and thereby the packing, namely, the state of void generation was evaluated. The evaluation was performed in the same manner as the eighth to fourteenth examples.

The evaluated results are also shown in Table 4.

TABLE 3

| | Metal film-forming Composition | Sintering Temperature (Degrees Celsius) | Performance Test for Seed Layer | |
|---|---|---|---|---|
| | | | Surface Resistance Value ($\Omega/\square$) | Adhesion Test |
| Example 15 | 1 | 180 | 1.1 | A |
| Example 16 | 2 | 180 | 1.0 | A |
| Example 17 | 3 | 230 | 1.2 | A |
| Example 18 | 4 | 230 | 1.2 | A |
| Example 19 | 5 | 180 | 1.1 | A |
| Example 20 | 6 | 200 | 1.4 | A |
| Example 21 | 7 | 180 | 1.2 | A |

TABLE 4

| | Resistance Value of Contact Plug | | | Packing of Cross-section |
|---|---|---|---|---|
| | <0.1Ω | 0.1~10Ω | 10Ω< | of through part |
| Example 15 | 20 | 0 | 0 | ○ |
| Example 16 | 20 | 0 | 0 | ○ |
| Example 17 | 20 | 0 | 0 | ○ |
| Example 18 | 20 | 0 | 0 | ○ |
| Example 19 | 20 | 0 | 0 | ○ |
| Example 20 | 20 | 0 | 0 | ○ |
| Example 21 | 0 | 3 | 17 | △ |

The present invention is described above by way of Examples, but the present invention is not limited to the embodiments or the Examples described above. The present invention allows various changes, modifications, and combinations. For example, a bottom end of a contact plug and a lower wire both constituting a three-dimensional interconnection may be connected directly without any intervention of a barrier layer as described in embodiment 1, or alternatively may be connected via a barrier layer as described in embodiment 2, embodiment 4, and Examples 8 to 21. Even in the case of connecting a contact plug and a lower wire via a barrier layer, if a surface of the barrier layer is prevented from being passivated by oxidation, nitriding, or the like after forming the barrier layer but prior to forming the bottom seed layer, the contact resistance value of the contact plug and the lower wire can be controlled to a relatively low value. The passivation on the surface of the barrier layer can be prevented, for example, by performing the formation of the barrier layer and the formation of the bottom seed layer under a continuous vacuum environment.

A circuit arrangement having the three-dimensional interconnection of the present invention may be a wiring board having a multilevel interconnection structure such as a buildup wiring board, a circuit board, or a mounting substrate. The method for forming a three-dimensional wire of the present invention can suitably be applied to formation of a three-dimensional interconnection composed of a plurality of damascene wires.

What is claimed is:

1. A method for forming a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug, the method comprising:
    forming a coating film on an upper surface of the substrate or the electrically insulative film and on an inner surface of the through hole or an inner surface of the blind via hole by applying a metal film-forming composition containing at least one of a salt of and a particle of a metal selected from Group 10 and Group 11 of the Periodic Table to the substrate or the electrically insulative film provided with the through hole or to the substrate or the electrically insulative film provided with the blind via hole becoming the through hole;
    forming a metal film by heating the coating film,
    plating by filling up the through hole or the blind via hole by depositing a conductor on the metal film by a plating process using the metal film as a seed layer; and
    removing, by a chemical mechanical polishing process, an excess conductor deposited in the plating.

2. The method for forming a three-dimensional interconnection according to claim 1, wherein the metal film-forming composition has a viscosity of 1 Pa·s or less and a metal concentration of 5 to 50% by mass.

3. The method for forming a three-dimensional interconnection according to claim 1, wherein the coating film is heated to 100 to 200° C. in an atmosphere with an oxygen concentration of 500 ppm or less or vacuum in the forming of the metal film.

4. The method for forming a three-dimensional interconnection according to claim 1, wherein the metal film formed by heating the coating film has an average value of thickness on the inner wall of the through hole or the inner wall of the blind via hole of 10 to 2000 nm.

5. The method for forming a three-dimensional interconnection according to claim 1, wherein the metal film is a sintered film of copper particles.

6. The method for forming a three-dimensional interconnection according to claim 1, wherein the through hole or the blind via hole has an opening diameter of 1 to 100 μm and a depth of 20 to 200 μm and the ratio of the depth to the opening diameter ranges from 1 to 50.

7. The method for forming a three-dimensional interconnection according to claim 1, further comprising, prior to the forming of the metal film: forming a high melting point film that serves as a base material of a barrier layer on an inner surface of the through hole or the blind via hole.

8. A method for forming a three-dimensional interconnection in which a contact plug is formed within a through hole provided in a substrate or an electrically insulative film and an upper wire formed on an upper side of the substrate or the electrically insulative film and a lower wire formed on a lower side of the substrate or the electrically insulative film are electrically connected to one another by the contact plug, the method comprising:
  forming a through hole or a blind via hole in the substrate or the electrically insulative film;
  forming a bottom seed layer by depositing a conductor by a vapor phase deposition process on a lower end side of the through hole or on a bottom surface of the blind via hole;
  forming a coating film covering an upper surface of the substrate or the electrically insulative layer, an inner wall of the through hole or the blind via hole, and an upper surface of the bottom seed layer by applying a metal film-forming composition containing at least one of a salt of and a particle of a metal selected from Group 10 and Group 11 of the Periodic Table to the substrate or the electrically insulative film provided thereon with the bottom seed layer;
  forming a metal film by heating the coating film,
  plating by filling up the through hole or the blind via hole by depositing a conductor on the metal film by a plating process using the metal film as a seed layer; and
  removing, by a chemical mechanical polishing process, an excess conductor deposited in the plating.

9. The method for forming a three-dimensional interconnection according to claim 8, wherein the metal film-forming composition has a viscosity of 1 Pa·s or less and a metal concentration of 5 to 50% by mass.

10. The method for forming a three-dimensional interconnection according to claim 8, wherein the coating film is heated to 100 to 200° C. in an atmosphere with an oxygen concentration of 500 ppm or less or vacuum in the forming of the metal film.

11. The method for forming a three-dimensional interconnection according to claim 8, wherein the metal film formed by heating the coating film has an average value of thickness on the inner wall of the through hole or the inner wall of the blind via hole of 10 to 2000 nm.

12. The method for forming a three-dimensional interconnection according to claim 8, wherein the metal film is a sintered film of copper particles.

13. The method for forming a three-dimensional interconnection according to claim 8, wherein the through hole or the blind via hole has an opening diameter of 1 to 100 μm and a depth of 20 to 200 μm and the ratio of the depth to the opening diameter ranges from 1 to 50.

14. The method for forming a three-dimensional interconnection according to claim 8, further comprising, prior to the forming of the metal film: forming a high melting point film that serves as a base material of a barrier layer on an inner surface of the through hole or the blind via hole.

15. A circuit arrangement comprising a three-dimensional interconnection formed by the method for forming a three-dimensional interconnection according to claim 1.

16. A circuit arrangement comprising a three-dimensional interconnection formed by the method for forming a three-dimensional interconnection according to claim 8.

* * * * *